(12) United States Patent
Ozawa

(10) Patent No.: US 12,360,218 B2
(45) Date of Patent: Jul. 15, 2025

(54) PHOTODETECTION DEVICE AND DISTANCE MEASUREMENT DEVICE

(71) Applicant: Sony Semiconductor Solutions Corporation, Kanagawa (JP)

(72) Inventor: Osamu Ozawa, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 1070 days.

(21) Appl. No.: 17/311,151

(22) PCT Filed: Nov. 15, 2019

(86) PCT No.: PCT/JP2019/044832
§ 371 (c)(1),
(2) Date: Jun. 4, 2021

(87) PCT Pub. No.: WO2020/121736
PCT Pub. Date: Jun. 18, 2020

(65) Prior Publication Data
US 2022/0026541 A1    Jan. 27, 2022

(30) Foreign Application Priority Data
Dec. 11, 2018   (JP) ................................. 2018-231363

(51) Int. Cl.
*G01S 7/4861*   (2020.01)
*G01S 17/08*    (2006.01)

(52) U.S. Cl.
CPC ............ *G01S 7/4861* (2013.01); *G01S 17/08* (2013.01)

(58) Field of Classification Search
CPC ........ G01S 17/08; G01S 17/10; G01S 17/894; G01S 17/931; H03K 17/941
See application file for complete search history.

(56) References Cited

U.S. PATENT DOCUMENTS

| 5,852,491 A | 12/1998 | Kato |
| 6,842,232 B2 * | 1/2005 | Miremadi .......... A63B 24/0021 356/5.01 |

(Continued)

FOREIGN PATENT DOCUMENTS

| CN | 101887688 A | 11/2010 |
| CN | 102122486 A | 7/2011 |

(Continued)

OTHER PUBLICATIONS

International Search Report (PCT/ISA/210), International Application No. PCT/JP2019/044832, dated Dec. 13, 2019.

(Continued)

*Primary Examiner* — Isam A Alsomiri
*Assistant Examiner* — Joseph C Fritchman
(74) *Attorney, Agent, or Firm* — Michael Best & Friedrich LLP

(57) ABSTRACT

A photodetection device according to the present disclosure includes: a light-receiving element; a load circuit connected to the light-receiving element; a switch circuit connected to the light-receiving element; and a feedback circuit configured to operate the switch circuit in accordance with an output from the light-receiving element. The feedback circuit has a delay circuit. A distance measurement device according to the present disclosure includes: a light source configured to radiate light toward a measurement object; and a photodetection device configured to detect light reflected by the measurement object, wherein the photodetection device configured as described above is used as the photodetection device.

16 Claims, 14 Drawing Sheets

(56) References Cited

U.S. PATENT DOCUMENTS

| | | | | |
|---|---|---|---|---|
| 9,671,284 | B1* | 6/2017 | Dandin | H03K 17/74 |
| 10,634,556 | B2* | 4/2020 | Fukuchi | H04N 25/773 |
| 2001/0020673 | A1* | 9/2001 | Zappa | G01J 1/44 |
| | | | | 250/214 R |
| 2013/0248689 | A1 | 9/2013 | Eldesouki | |
| 2014/0061443 | A1 | 3/2014 | Jiang | |
| 2018/0266881 | A1 | 9/2018 | Fujiwara | |
| 2019/0250257 | A1* | 8/2019 | Finkelstein | G01S 7/487 |
| 2021/0293958 | A1* | 9/2021 | Hirono | H01L 31/107 |

FOREIGN PATENT DOCUMENTS

| | | |
|---|---|---|
| CN | 103683880 A | 3/2014 |
| CN | 105374832 A | 3/2016 |
| CN | 108061603 A | 5/2018 |
| CN | 108681362 A | 10/2018 |
| JP | 02-503114 A | 9/1990 |
| JP | 10-048338 A | 2/1998 |
| JP | 2000077705 A | 3/2000 |
| JP | 2002-328170 A | 11/2002 |
| JP | 2009-236650 A | 10/2009 |
| JP | 2009-236657 A | 10/2009 |
| JP | 2014-081254 A | 5/2014 |
| JP | 2015-078953 A | 4/2015 |
| JP | 2015-081780 A | 4/2015 |
| JP | 2016-211881 A | 12/2016 |
| WO | WO-2017149526 A | 9/2017 |

OTHER PUBLICATIONS

Notification of Transmittal of the International Search Report and the Written Opinion of the International Searching Authority, or the Declaration (PCT/ISA/220), International Application No. PCT/JP2019/044832, dated Jan. 7, 2020.

Written Opinion of the International Search Authority (PCT/ISA/237), International Application No. PCT/JP2019/044832, dated Jan. 7, 2020.

Zheng Hao et al.; "An Analog Front-end Readout Circuits for 4x4 Matrix Quadrant APD Sensor", pp. 214-218, 229, Research & Progress of SSE, vol. 38, No. 03, Jun. 25, 2018.

* cited by examiner

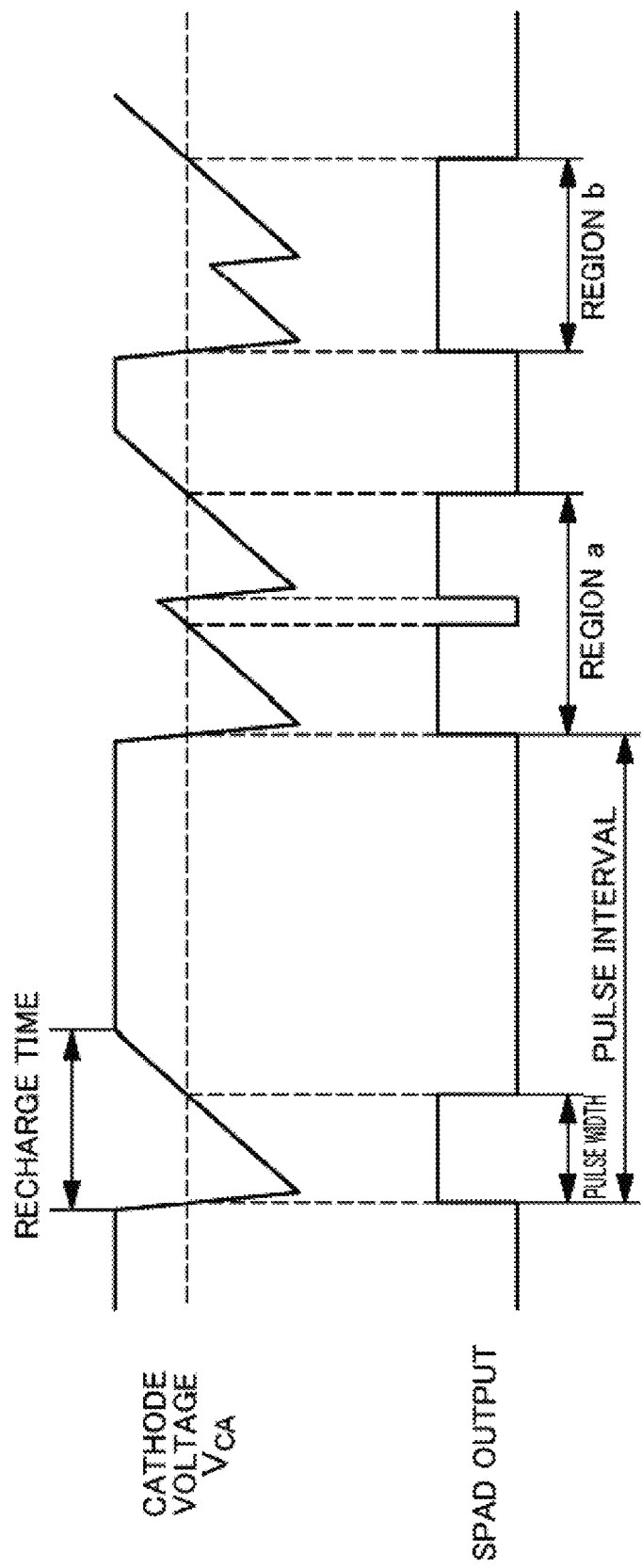

PHOTODETECTION DEVICE AND DISTANCE MEASUREMENT DEVICE

TECHNICAL FIELD

The present disclosure relates to a photodetection device and a distance measurement device.

BACKGROUND ART

As a light-receiving element (a light-receiving portion) that performs photodetection, there are distance measurement devices using an element that generates a signal in response to receiving a photon (for example, refer to PTL 1).

With the distance measurement device according to conventional art, based on a measurement result of a ToF (Time of Flight), the number of pulses is detected when light intensity is low but a width of the pulses is detected when light intensity is high.

CITATION LIST

Patent Literature

[PTL 1]
JP 2014-081254 A

SUMMARY

Technical Problem

A photodetection operation using a light-receiving element that generates a signal in response to receiving a photon is, for example, a photodetection operation using a SPAD (Single Photon Avalanche Diode) element and is performed by repetitively generating/suspending an avalanche current. In addition, recovery of a cathode voltage that is lowered by the avalanche current is performed by a recharge circuit connected to the light-receiving element.

There are two systems of pixel circuits including a light-receiving element: a passive system that passively controls an avalanche current; and an active system that actively performs switching by controlling timings or the like. While the active system has a higher degree of freedom of adjustment than the passive system, contrarily, unless timing control is performed accurately, there is a possibility that a malfunction may occur or an overvoltage equal to or exceeding a rated value may be applied to a circuit element and cause the circuit element to deteriorate.

PTL 1 described above discloses a pixel circuit adopting the passive system. Therefore, the conventional art described in PTL 1 does not take into consideration the risk inherent to the active system described above or, more specifically the risk of a circuit element being subjected to an overvoltage.

An object of the present disclosure is to provide a photodetection device capable of reducing the risk of a circuit element being subjected to an overvoltage while maintaining advantages of an active system and a distance measurement device that includes the photodetection device.

Solution to Problem

A photodetection device according to the present disclosure for achieving the object described above includes:
  a light-receiving element;
  a load circuit connected to the light-receiving element;
  a switch circuit connected to the light-receiving element; and
  a feedback circuit configured to operate the switch circuit in accordance with an output from the light-receiving element, wherein
  the feedback circuit has a delay circuit.

In addition, a distance measurement device (a distance-measuring device) according to the present disclosure for achieving the object described above includes:
  a light source configured to radiate light toward a measurement object with; and a photodetection device configured to detect light reflected by the measurement object, wherein
  the photodetection device configured as described above is used as the photodetection device.

BRIEF DESCRIPTION OF DRAWINGS

FIG. 5 is a waveform diagram for explaining a dead time DT of a SPAD element when a radiating light amount is relatively small.

DESCRIPTION OF EMBODIMENTS

Figure 1:
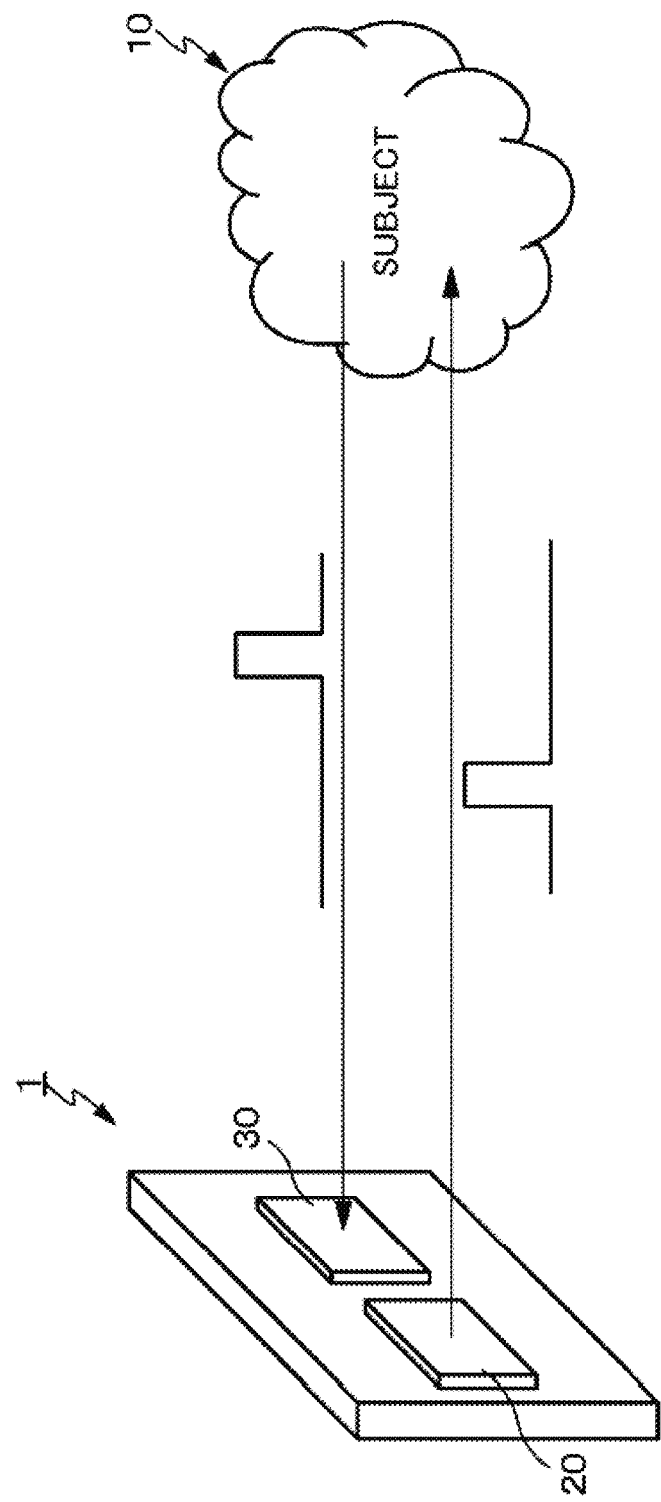
FIG. 1 is a schematic configuration diagram showing a distance measurement device according to an embodiment of the present disclosure.

Hereinafter, a mode (hereinafter, referred to as an embodiment) for implementing the technique according to the present disclosure will be described in detail with reference to the drawings. It is to be understood that the technique according to the present disclosure is not limited to the embodiment and various numerical values and the like in the embodiment are exemplary. In the following description, a same reference sign will be used for a same element or elements having a same function and redundant descriptions will be omitted. The description will be given in the following order.

1. General description of photodetection device and distance measurement device according to present disclosure
2. Distance measurement device according to embodiment
 2-1. Outline of configuration of distance measurement device
 2-2. Basic pixel circuit of photodetection device using SPAD element
  2-2-1. Pixel circuit according to first example of passive system
  2-2-2. Pixel circuit according to second example of passive system
  2-2-3. Circuit operations of pixel circuit of passive system
  2-2-4. Dead time DT
  2-2-5. Pixel circuit of active system
  2-2-6. Circuit operations of pixel circuit of active system
3. Photodetection device according to embodiment
 3-1. First example (example combining passive circuit and active circuit)
 3-2. Second example (modification of first example: example of adjusting amount of delay based on voltage monitoring result)
 3-3. Third example (modification of first example: example of including comparator in feedback circuit)
 3-4. Fourth example (modification of third example: configuration example provided with separate paths for SPAD output and active recharge)
4. Example of application of technique according to present disclosure (example of mobile body)
5. Configurations adoptable by present disclosure <General Description of Photodetection Device and Distance Measurement Device According to Present Disclosure>

With the photodetection device and the distance measurement device according to the present disclosure, a delay circuit can be configured such that an amount of delay is variable. In addition, a configuration can be adopted in which the amount of delay of the delay circuit is controlled in accordance with an element characteristic of the light-receiving element. A mode can be adopted in which the element characteristic of the light-receiving element is a temperature of the light-receiving element.

With the photodetection device and the distance measurement device according to the present disclosure including the preferable mode and configuration described above, a configuration can be adopted in which the amount of delay of the delay circuit is controlled based on a monitoring result of a fluctuation of a power supply voltage.

In addition, with the photodetection device and the distance measurement device according to the present disclosure including the preferable modes and configurations described above, a configuration can be adopted in which the feedback circuit further includes a comparator. The comparator can be configured to receive an output from the light-receiving element as a comparison input, receive a reference voltage as a comparison reference input, and provide the delay circuit with a comparison result thereof as an input. In addition, a configuration can be adopted in which a voltage value of the reference voltage of the comparator is variable.

Furthermore, with the photodetection device and the distance measurement device according to the present disclosure including the preferable modes and configurations described above, a configuration can be adopted in which the comparison result of the comparator is derived as a pixel circuit output based on an output of the light-receiving element. Alternatively, a configuration can be adopted in which a path including the feedback circuit is a separate path from a path for deriving an output of the light-receiving element as a pixel circuit output.

Furthermore, with the photodetection device and the distance measurement device according to the present disclosure including the preferable modes and configurations described above, a configuration can be adopted in which the light-receiving element is an element configured to generate a signal in accordance with the reception of a photon. Moreover, a configuration can be adopted in which the light-receiving element is constituted by a single photon avalanche diode.

<Distance Measurement Device According to Embodiment>

[Outline of Configuration of Distance Measurement Device]

FIG. 1 is a schematic configuration diagram showing a distance measurement device according to the embodiment of the present disclosure. A distance measurement device 1 according to the present embodiment adopts, as a measurement method for measuring a distance to a subject 10 that is a measurement object, a ToF method of measuring time until light (for example, laser light) having been emitted toward the subject 10 returns after being reflected by the subject 10. In order to realize distance measurement by the ToF method, the distance measurement device 1 according to the present embodiment includes a light source 20 and a photodetection device 30. In addition, a photodetection device according to the embodiment of the present disclosure to be described later is used as the photodetection device 30.

Figure 2A:
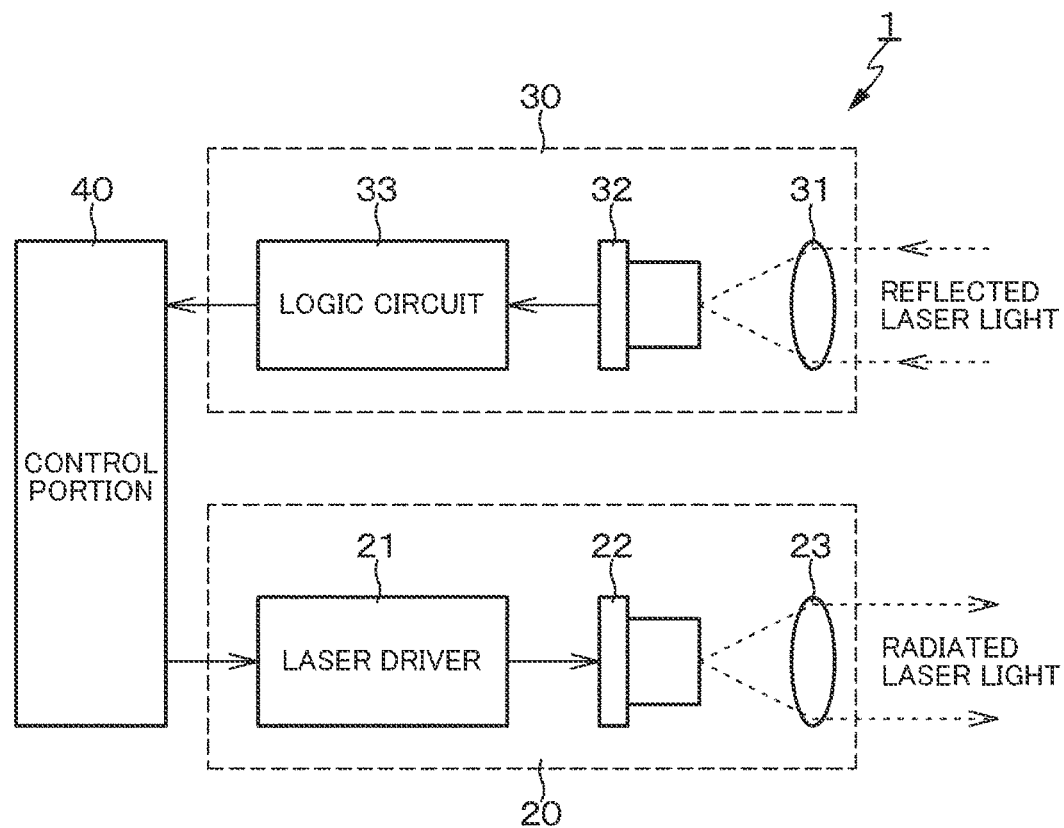
FIGS. 2A and 2B are block diagrams showing a specific configuration of the distance measurement device according to the embodiment of the present disclosure.
Figure 2B:
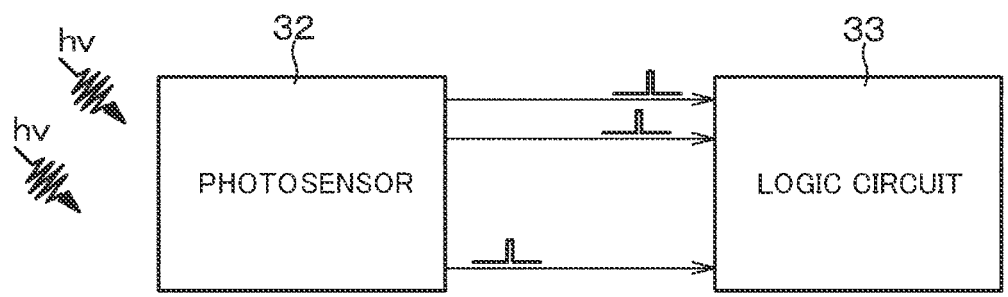

FIGS. 2A and 2B show a specific configuration of the distance measurement device 1 according to the present embodiment. For example, the light source 20 has a laser driver 21, a laser light source 22, and a diffusing lens 23 and radiates laser light toward the subject 10. The laser driver 21 drives the laser light source 22 under control of a control portion 40. The laser light source 22 is made of, for example, a semiconductor laser and emits laser light by being driven by the laser driver 21. The diffusing lens 23 diffuses laser light emitted from the laser light source 22 and radiates the diffused laser light toward the subject 10.

The photodetection device 30 has a light-receiving lens 31, a photosensor 32, and a logic circuit 33 and receives reflected laser light that is returning radiated laser light from a laser radiating portion 20 after being reflected by the subject 10. The light-receiving lens 31 collects reflected laser light from the subject 10 on a light-receiving surface of the photosensor 32. The photosensor 32 receives the reflected laser light from the subject 10 via the light-receiving lens 31 in units of a pixel and photoelectrically converts the reflected laser light. An output signal of the photosensor 32 is supplied to the control portion 40 via the logic circuit 33. Details of the photosensor 32 will be described later.

For example, the control portion 40 is constituted by a CPU (Central Processing Unit) or the like, controls the light source 20 and the photodetection device 30, and measures a time t until laser light having been emitted toward the subject 10 from the light source 20 returns after being reflected by the subject 10. A distance L to the subject 10 can be obtained based on the measured time t.

As a method of measuring the time t, the time t is measured by starting a timer at a timing where pulse light is emitted from the light source 20 and stopping the timer at a timing where the pulse light is received by the photodetection device 30. As another method of time measurement, pulse light may be emitted from the light source 20 at a predetermined period, a period upon the photodetection device 30 receiving the pulse light may be detected, and the time t may be measured based on a phase difference between the period of light emission and the period of light reception. Time measurement is executed a plurality of times and the time t is measured by detecting a peak of a histogram created by stacking up a plurality of measured times.

As the photosensor 32, a two-dimensional array sensor (a so-called area sensor) constituted by pixels including a light-receiving element (a light-receiving portion) and being arranged in a two-dimensional array or a one-dimensional array sensor (a so-called line sensor) constituted by pixels including a light-receiving element and being arranged linearly can also be used.

In addition, in the present embodiment, a sensor in which the light-receiving element of a pixel is constituted by an element that generates a signal in response to receiving a photon such as sensor made of a SPAD (Single Photon Avalanche Diode) element is used as the photosensor 32. In other words, the photodetection device 30 according to the present embodiment is configured such that the light-receiving element of a pixel is constituted by a SPAD element. It should be noted that the light-receiving element is not limited to a SPAD element and other various elements such as an APD (Avalanche Photo Diode) or a CAPD (Current Assisted Photonic Demodulator) may be used.

[Basic Pixel Circuit of Photodetection Device Using SPAD Element]

There are two systems of pixel circuits using a light-receiving element that generates a signal in response to receiving a photon: a passive system that passively controls an avalanche current; and an active system that actively performs switching by controlling timings or the like.

(Pixel Circuit According to First Example of Passive System)

Figure 3A:
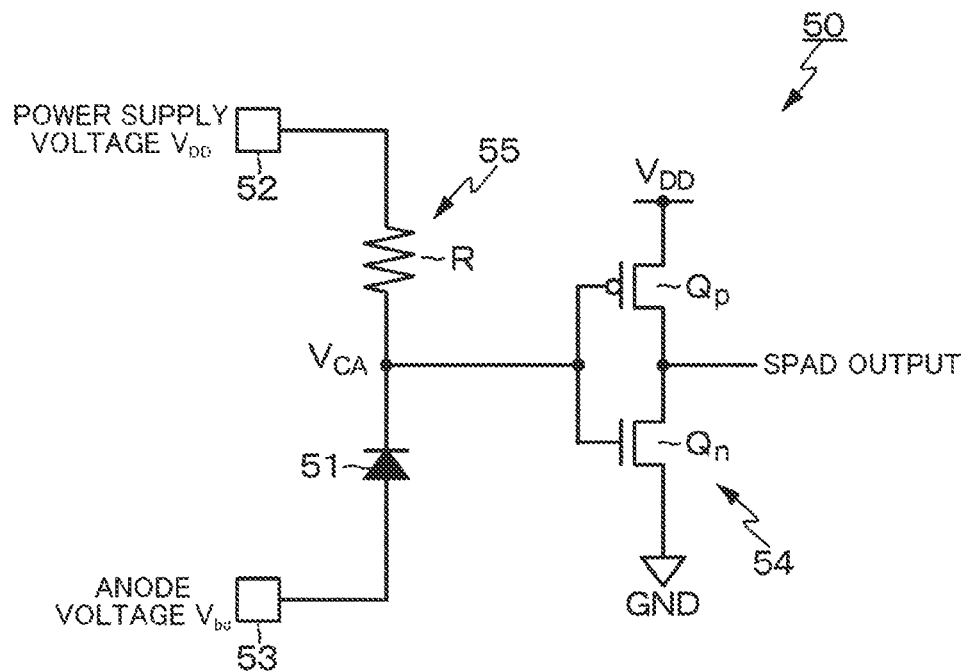
FIG. 3A is a circuit diagram showing a pixel circuit according to a first example of a passive system.

A first example of the passive system is an example in which a load circuit 55 is constituted by a resistive element R. FIG. 3A shows the pixel circuit according to the first example of the passive system.

In a SPAD element 51 of a pixel circuit 50 according to the first example of the passive system, a cathode electrode is connected via the resistive element R that is the load circuit 55 to a terminal 52 to which a power supply voltage $V_{DD}$ is applied and an anode electrode is connected to a terminal 53 to which an anode voltage $V_{bd}$ is applied. As the anode voltage $V_{bd}$, a negative voltage large enough to cause an avalanche multiplication is applied. In addition, a cathode voltage $V_{CA}$ of the SPAD element 51 is derived as a SPAD output (a pixel circuit output) via a waveform shaping circuit 54 constituted by a P-type MOS transistor $Q_p$ and an N-type MOS transistor $Q_n$.

A voltage equal to or higher than a breakdown voltage $V_{BD}$ (for example, −50 to −10 V) is applied to the SPAD element 51. An excess voltage equal to or higher than the breakdown voltage $V_{BD}$ is referred to as an excess bias voltage $V_{EX}$ and is generally a voltage of around 2 to 5 V. This is a larger value than a conventional photodiode. The SPAD element 51 operates in a region called a Geiger mode that is devoid of a DC stabilization point.

(Pixel Circuit According to Second Example of Passive System)

Figure 3B:
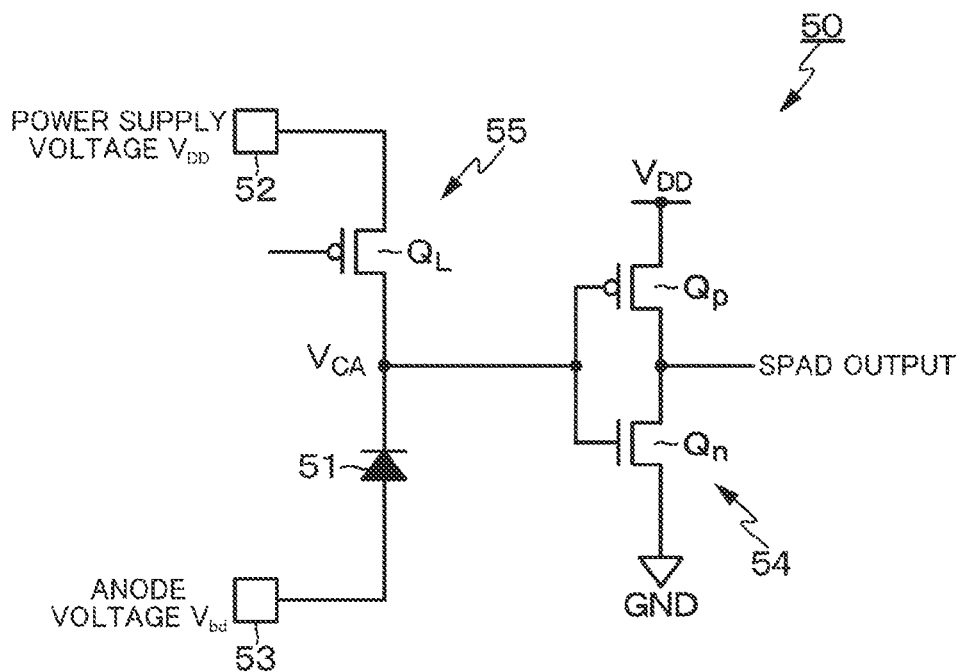
FIG. 3B is a circuit diagram showing a pixel circuit according to a second example of the passive system.

A second example of the passive system is an example in which the load circuit 55 is constituted by a constant-current source such as a P-type MOS transistor $Q_L$. FIG. 3B shows the pixel circuit according to the second example of the passive system.

The pixel circuit 50 according to the second example of the passive system only differs from the pixel circuit 50 according to the first example shown in FIG. 3A in that the load circuit 55 in the pixel circuit 50 according to the first example has been changed from the resistive element R to the P-type MOS transistor $Q_L$ and other circuit components are basically the same.

(Circuit Operations of Pixel Circuit of Passive System)

Figure 4A:
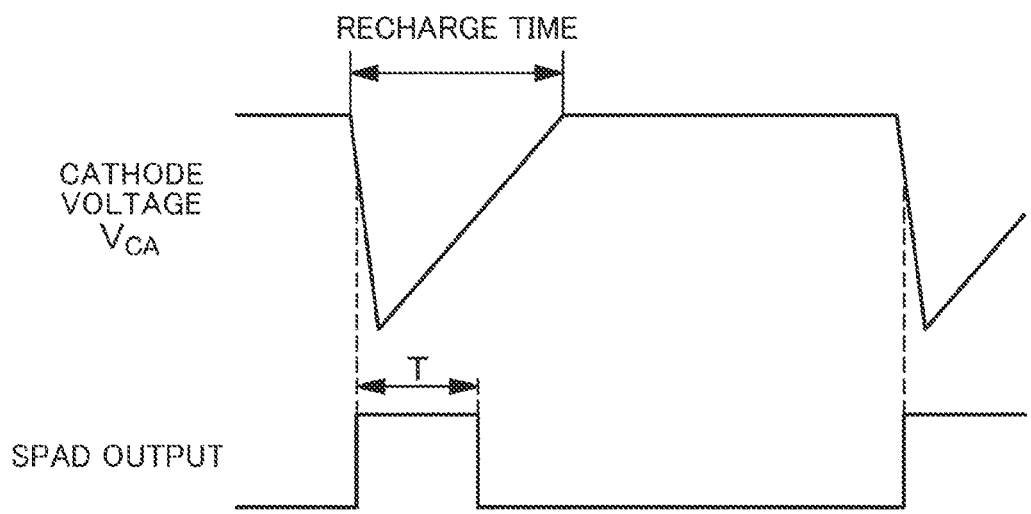
FIG. 4A is a waveform diagram for explaining a circuit operation of a pixel circuit of a passive system.

Circuit operations of the pixel circuit 50 of the passive system configured as described above will be described using a waveform diagram shown in FIG. 4A.

In a state where a current does not flow through the SPAD element 51, a voltage of $V_{DD}-V_{bd}$ is applied to the SPAD element 51. The voltage value ($V_{DD}-V_{bd}$) equates to ($V_{BD}+V_{EX}$). In addition, electrons generated due to a dark electron generation rate DCR (Dark Count Rate) and light radiation at the PN junction of the SPAD element 51 causes an avalanche multiplication to occur and an avalanche current $I_a$ is generated. This phenomenon probabilistically occurs even in a state where light is shielded (in other words, a state where there is no incident light). This is called a dark electron generation rate DCR.

When the cathode voltage $V_{CA}$ drops and an inter-terminal voltage of the SPAD element 51 or, in other words, the cathode voltage $V_{CA}$ becomes equal to the breakdown voltage $V_{BD}$ of the PN diode, the avalanche current $I_a$ is suspended. This operation is a so-called quench operation and the cathode voltage $V_{CA}$ of the SPAD element 51 at this point is a quench voltage.

Subsequently, by supplying a recharge current $I_r$ from the resistive element R or the P-type MOS transistor $Q_L$ that constitutes the load circuit 55, the cathode voltage $V_{CA}$ of the SPAD element 51 recovers from the quench voltage to the power supply voltage $V_{DD}$ and returns to its initial state. In other words, the load circuit 55 constituted by the resistive element R or the P-type MOS transistor $Q_L$ is a recharge circuit which supplies the SPAD element 51 with the recharge current $I_r$ in order to restore the cathode voltage $V_{CA}$ of the SPAD element 51.

Even when one electron-hole pair is generated by incidence of light to the SPAD element 51, since the electron-hole pair acts as a seed and the avalanche current $I_a$ is generated, the incidence of even one photon can be detected at a certain probabilistic PDE (Photon Detection Efficiency). The probabilistic PDE at which a photon can be detected is usually around several % to 20%.

The operations described above are repetitively performed. In addition, in the series of operations, a waveform of the cathode voltage $V_{CA}$ is shaped by the waveform shaping circuit 54 and a pulse signal with a pulse width T of which an arrival time of one photon is a start point becomes an SPAD output (a pixel circuit output).

The SPAD element 51 is a high-performance photosensor capable of detecting the incidence of a single photon at a certain probabilistic PDE. However, once a photon is detected, there is a period of several ns to several ten ns during which the SPAD element 51 cannot react to a photon as a photosensor or, in other words, a dead time DT.

Therefore, when a detection frequency of photons rises under a high light intensity condition and a total period of the dead time DT becomes non-negligible with respect to observation time, photodetection accuracy declines.

As described above, in the pixel circuit 50 of the passive system, the avalanche current $I_a$ flows through the SPAD element 51 and, when the voltage applied to the SPAD element 51 decreases, the avalanche current $I_a$ stops by itself and a switch is made to a recharge operation in which the recharge current $I_r$ is supplied. In other words, while the avalanche current $I_a$ flows in a section in which the cathode voltage $V_{CA}$ drops, the recharge current $I_r$ starts to flow as the cathode voltage $V_{CA}$ starts to drop and, therefore, the cathode voltage $V_{CA}$ does not experience an excessive potential drop.

In the case of the pixel circuit 50 of the passive system described above, since operations for repetitively switching on and off both the avalanche current $I_a$ and the recharge current $I_r$ are independently performed without any external control, risks of a malfunction and the like are low. However, since the recharge current $I_r$ must be set sufficiently smaller than the avalanche current $I_a$, a timing is determined when circuit elements are finished, which requires that settings be configured in consideration of a worst possible state and makes it difficult to improve characteristics.

(Dead Time DT)

The dead time DT during which the SPAD element 51 cannot react to photons as a photosensor will now be described in greater detail using a waveform diagram shown in FIG. 5. As described above, in the SPAD element 51, there exists a dead time DT attributable to a time required by the cathode voltage $V_{CA}$ to recover to the power supply voltage $V_{DD}$ in which incidence of light cannot be reacted to. For example, while an avalanche multiplication occurs twice and, accordingly, two pulse signals are generated as SPAD output in a region a, only one pulse signal is generated despite an avalanche multiplication occurring twice in a region b.

Theoretically, the SPAD element 51 does not generate a SPAD output with respect to incidence of light that occurs after an initial reaction by the SPAD element 51 and until the cathode voltage $V_{CA}$ reaches or exceeds a threshold voltage of the waveform shaping circuit 54 of a subsequent stage. In other words, this period constitutes the dead time DT and a pulse width T represents a limit value thereof.

(Pixel Circuit of Active System)

Figure 6:
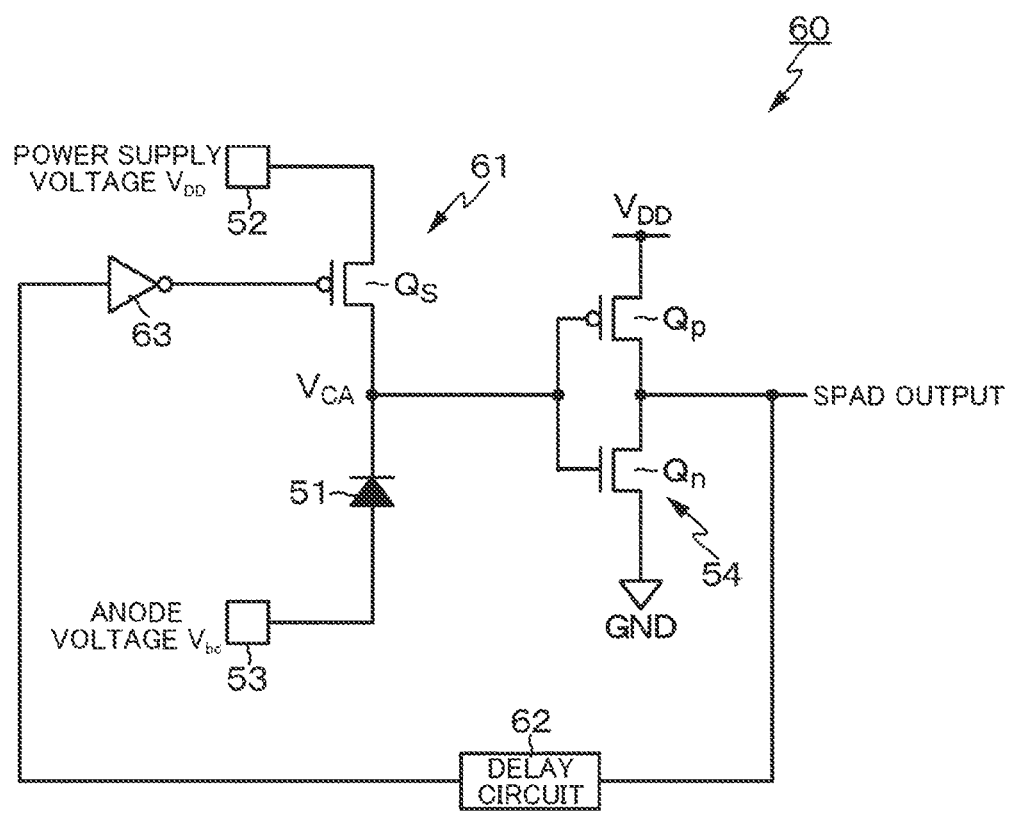
FIG. 6 is a circuit diagram showing a pixel circuit of an active system.

FIG. 6 shows a pixel circuit of an active system. A pixel circuit 60 of the active system is configured to include, in addition to the SPAD element 51 and the waveform shaping circuit 54, a switch circuit 61, a delay circuit 62, and an inverter circuit 63.

The switch circuit 61 is constituted by the terminal 52 to which the power supply voltage $V_{DD}$ is applied and, for example, a P-type MOS transistor $Q_S$ that is connected between the terminal 52 and a cathode electrode of the SPAD element 51. An input terminal of the delay circuit 62 is connected to an output terminal of the waveform shaping circuit 54. An input terminal of the inverter circuit 63 is connected to an output terminal of the delay circuit 62, and an output terminal of the inverter circuit 63 is connected to a gate electrode of the P-type MOS transistor $Q_S$.

(Circuit Operations of Pixel Circuit of Active System)

Figure 4B:
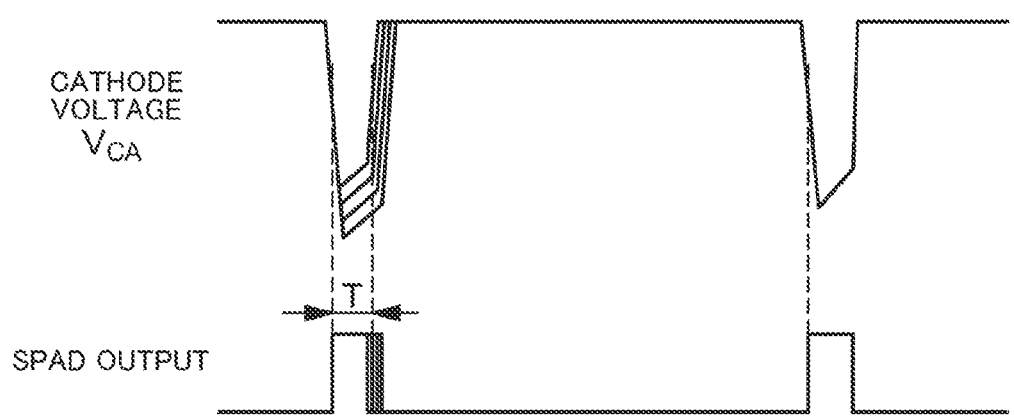
FIG. 4B is a waveform diagram for explaining a circuit operation of a pixel circuit of an active system.

Circuit operations of the pixel circuit 60 of the active system configured as described above will be described using a waveform diagram shown in FIG. 4B.

In the pixel circuit 60 of the active system configured as described above, an output of the waveform shaping circuit 54 or, in other words, a SPAD output is delayed by a predetermined amount of delay by the delay circuit 62, logically inverted by the inverter circuit 63, and applied to the gate electrode of the P-type MOS transistor $Q_S$. In other words, the P-type MOS transistor $Q_S$ of the switch circuit 61 is to perform an on and off operation in accordance with the SPAD output.

In addition, in the pixel circuit 60 of the active system, as the avalanche current $I_a$ flows through the SPAD element 51 and a logic of the output of the waveform shaping circuit 54 or, in other words, the SPAD output is inverted, a recharge operation is performed with a large current after a desired time representing the amount of delay of the delay circuit 62 regardless of a state of potential of the SPAD element 51.

The recharge current $I_r$ does not flow in a section in which the cathode voltage $V_{CA}$ drops. Although the avalanche current $I_a$ lowers the cathode voltage $V_{CA}$, since a current value of the avalanche current $I_a$ is random, a lower limit voltage of the cathode voltage $V_{CA}$ varies and may end up excessively lowering the cathode voltage $V_{CA}$.

With the pixel circuit 60 of the active system described above, since the avalanche current $I_a$ and the recharge current $I_r$ are switched on and off according to external signals, there is a high degree of freedom of timing control. In addition, since the recharge current $I_r$ is not limited, there is an advantage that a dead time DT during which the pixel circuit 60 cannot react to a photon as a photosensor can be shortened down to a theoretical limit value.

However, in the case of the pixel circuit 60 of the active system, depending on operating conditions, the recharge current $I_r$ may inadvertently flow through the SPAD element 51 before a quench operation is completed. In addition, there is a possibility that a variation in the quench voltage causes the cathode voltage $V_{CA}$ of the SPAD element 51 to drop more than expected, and an overvoltage equal to or exceeding a rated value may be applied to a circuit element and cause the circuit element to deteriorate.

<Photodetection Device According to Embodiment>

A photodetection device according to the embodiment of the present disclosure is configured to include: a load circuit connected a SPAD element that is an example of a light-receiving element; a switch circuit connected to the SPAD element; and a feedback circuit configured to operate the switch circuit in accordance with an output from the SPAD element, wherein the feedback circuit includes a delay circuit. This configuration enables deterioration of characteristics of a circuit element to be suppressed by preventing an overvoltage equal to or exceeding a rated value from being generated and reducing a risk of the overvoltage being applied to the circuit element while maintaining advantages of the active system.

Hereinafter, specific examples of the present embodiment which reduces a risk of an overvoltage being applied to circuit elements while maintaining advantages of the active system will be described.

First Example

Figure 7:
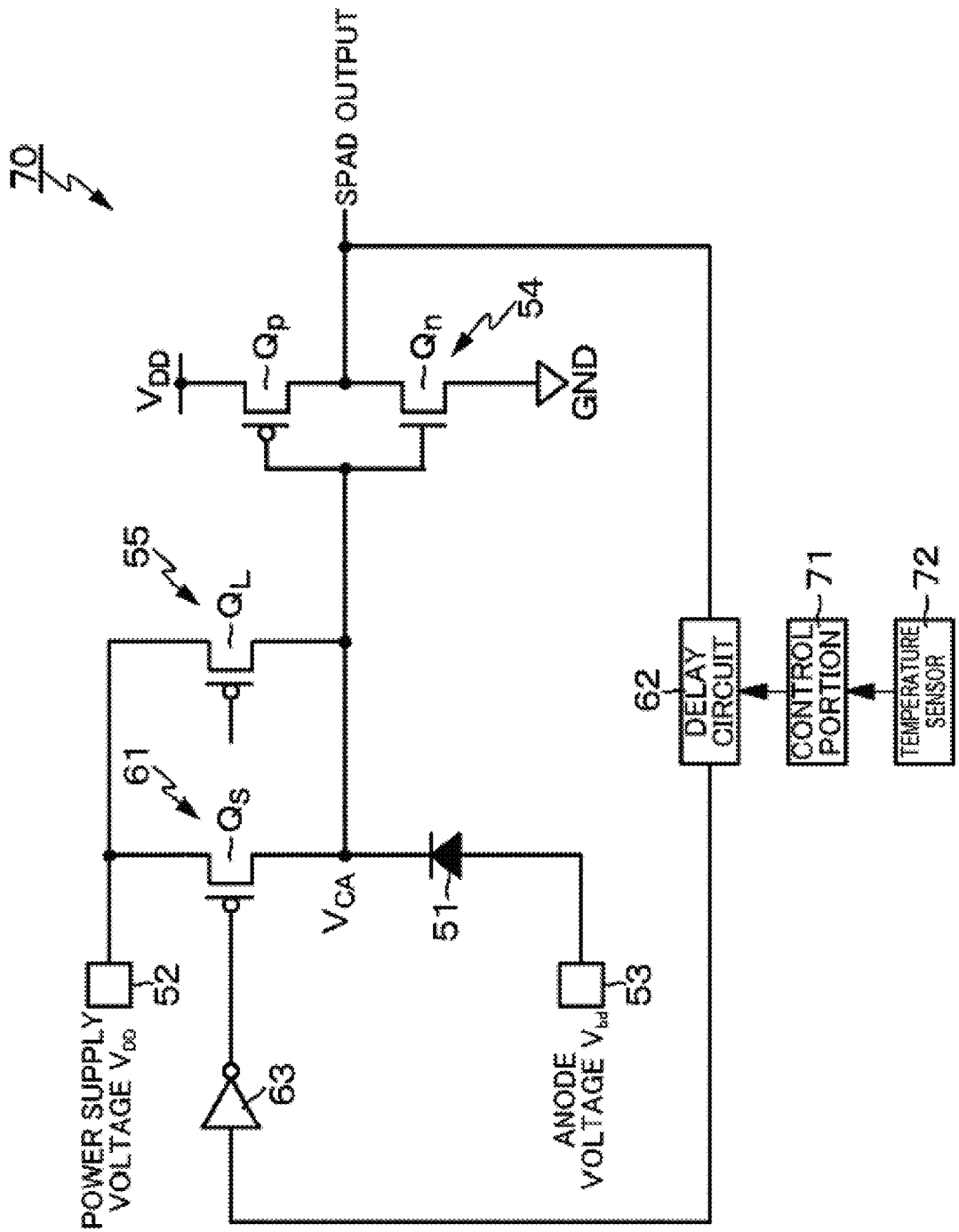
FIG. 7 is a circuit diagram showing a pixel circuit in a photodetection device according to a first example.

A first example represents an example of a hybrid recharge system which combines a passive circuit and an active circuit. FIG. 7 shows a circuit diagram of a pixel circuit in a photodetection device according to the first example.

FIG. 7 illustrates a circuit configuration corresponding to one pixel. A pixel circuit 70 of the hybrid recharge system is configured to include, in addition to the SPAD element 51 and the waveform shaping circuit 54, the load circuit 55, the switch circuit 61, the delay circuit 62, the inverter circuit 63, a control portion 71, and a temperature sensor 72. The control portion 71 and the temperature sensor 72 are to be commonly provided with respect to a plurality of pixel circuits 70.

In the pixel circuit 70 according to the first example, the load circuit 55 is a recharge circuit of the passive system and the switch circuit 61 is a recharge circuit of the active system. Therefore, the recharge circuit of the pixel circuit 70 according to the first example represents a hybrid recharge circuit which combines a passive recharge circuit and an active recharge circuit.

While a case where a constant-current source constituted by a P-type MOS transistor $Q_L$ is used as the load circuit 55 that is a recharge circuit of the passive system has been exemplified, alternatively, the resistive element R (refer to FIG. 3A) may be used as the load circuit 55. This description similarly applies to the examples to be described later.

Figure 8A:
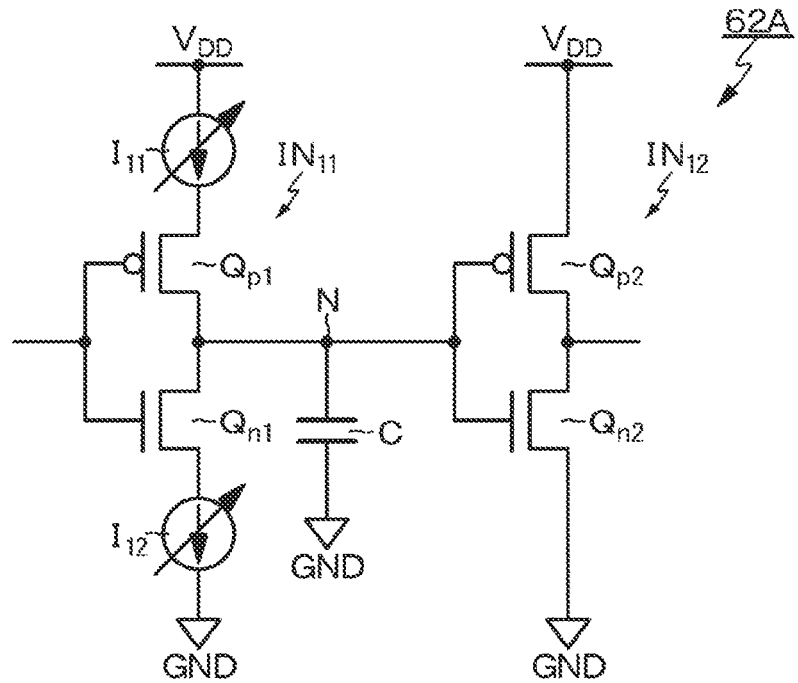
FIG. 8A is a circuit diagram showing a first circuit example of a delay circuit of which an amount of delay is variable.
Figure 8B:
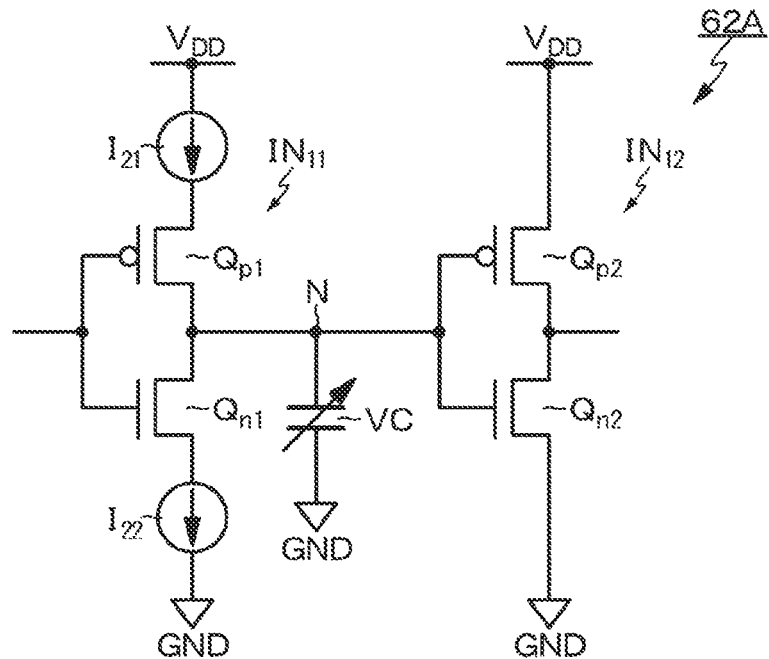
FIG. 8B is a circuit diagram showing a second circuit example of the same.

The delay circuit 62 is provided midway along a path from the SPAD output to control input of the switch circuit 61 and forms a feedback circuit for active recharge. In addition, the delay circuit 62 is configured such that an amount of delay is variable. The amount of delay of the delay circuit 62 is controlled by the control portion 71. A specific circuit configuration of the delay circuit 62 of which the amount of delay is variable will now be described using a first circuit example shown in FIG. 8A and a second circuit example shown in FIG. 8B.

A delay circuit 62A according to the first circuit example and a delay circuit 62B according to the second circuit example are both configured such that two inverters $IN_{11}$ and $IN_{12}$ are cascade-connected and a capacitative element C is connected between a common connection node N of the two inverters $IN_{11}$ and $IN_{12}$ and a GND node that is a node of a reference potential. The inverter $IN_{11}$ is constituted by a P-type MOS transistor $Q_{p1}$ and an N-type MOS transistor $Q_{n1}$ and the inverter $IN_{12}$ is constituted by a P-type MOS transistor $Q_{p2}$ and an N-type MOS transistor $Q_{n2}$.

In addition to the circuit elements described above, the delay circuit 62A according to the first circuit example has a variable current source $I_{11}$ which is connected between one end of the inverter $IN_{11}$ and a node of the power supply voltage $V_{DD}$ and of which a current value is variable and a variable current source $I_{11}$ which is connected between another end of the inverter $IN_{11}$ and the GND node and of which a current value is variable. Furthermore, with the delay circuit 62 according to the first circuit example, an amount of delay is adjusted by controlling current values of the variable current sources $I_{11}$ and $I_{12}$. The current values of the variable current sources $I_{11}$ and $I_{12}$ are to be controlled under the control of the control portion 71.

In addition to the circuit elements described above, the delay circuit 62B according to the second circuit example has a constant-current source $I_{21}$ which is connected between one end of the inverter $IN_{11}$ and a node of the power supply voltage $V_{DD}$ and a constant-current source $I_{22}$ which is connected between another end of the inverter $IN_{11}$ and the GND node. Furthermore, the delay circuit 62 according to the second circuit example has a variable capacitative element VC of which a capacitance value is variable in place of the capacitative element C, and an amount of delay of the delay circuit 62 is adjusted by controlling the capacitance value of the variable capacitative element VC. The capacitance value of the variable capacitative element VC is to be controlled under the control of the control portion 71.

The control portion 71 controls an amount of delay of a delay circuit in accordance with an element characteristic of the SPAD element 51. As the element characteristic of the SPAD element 51, a temperature of the SPAD element 51 or, specifically, a junction temperature can be exemplified. The temperature sensor 72 detects the temperature of the SPAD element 51.

For example, the photodetection device has a laminated structure made by laminating at least two semiconductor substrates, namely, a first semiconductor substrate and a second semiconductor substrate, the SPAD element 51 is arranged in a two-dimensional array on the first semiconductor substrate, and circuit portions other than the SPAD element 51 such as the pixel circuit 50 are arranged on the second semiconductor substrate. In the laminated structure of the photodetection device, for example, the temperature sensor 72 can detect a temperature of the SPAD element 51 by being mounted on the second semiconductor substrate. As the temperature sensor 72, for example, a known temperature sensor can be used which measures a temperature by utilizing characteristics that electric properties change in proportion to a temperature change in a bandgap of a semiconductor.

In the pixel circuit 70 according to the first example configured as described above, due to PVT (Process, Voltage, Temperature) in which a variation in processes, a fluctuation in the power supply voltage, and a fluctuation in the junction temperature occur complexly, an optimum timing to switch on the switch circuit 61 that is an active recharge circuit differs. In consideration thereof, the control portion 71 adopts the temperature (specifically, the junction temperature) of the SPAD element 51 that is detected by the temperature sensor 72 as the element characteristic and adjusts the amount of delay of the delay circuit 62 in accordance with the element characteristic.

As described above, the pixel circuit 70 according to the first example is constituted by a combination of a passive recharge circuit and an active recharge circuit, and by adjusting the amount of delay of the delay circuit 62 in accordance with the temperature of the SPAD element 51 that is detected by the temperature sensor 72, a variation in the junction temperature is suppressed. Accordingly, a risk of an excessive drop in the cathode voltage $V_{CA}$ causing an overvoltage equal to or exceeding a rated value to be applied to circuit elements can be reduced while realizing a short dead time DT.

Figure 9A:
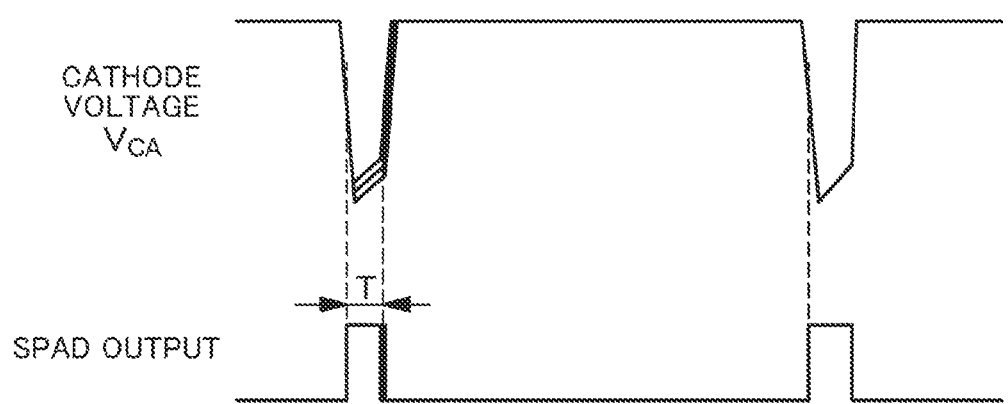
FIG. 9A is a waveform diagram of a cathode voltage and a SPAD output in a case where a dead time DT is short.
Figure 9B:
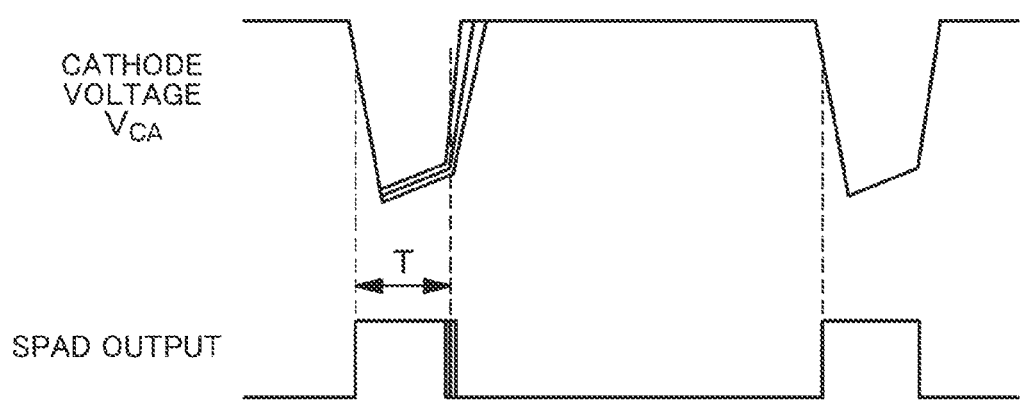
FIG. 9B is a waveform diagram of the cathode voltage and the SPAD output in a case where the dead time DT is long.

FIG. 9A shows a waveform diagram of the cathode voltage $V_{CA}$ and the SPAD output in a case where the dead time DT is short, and FIG. 9B shows a waveform diagram of the cathode voltage $V_{CA}$ and the SPAD output in a case where the dead time DT is long.

Due to PVT (Process, Voltage, Temperature), an optimum timing to switch on the active recharge circuit differs and, at the same time, the quench voltage of the SPAD element 51 contains some variation every time. In consideration thereof, a preliminary evaluation is performed and a lookup table with margins is prepared in advance, and the control portion 71 sets the amount of delay of the delay circuit 62 in accordance with conditions based on the lookup table. Accordingly, a minimum dead time DT under each condition can be realized.

Second Example

Figure 10:
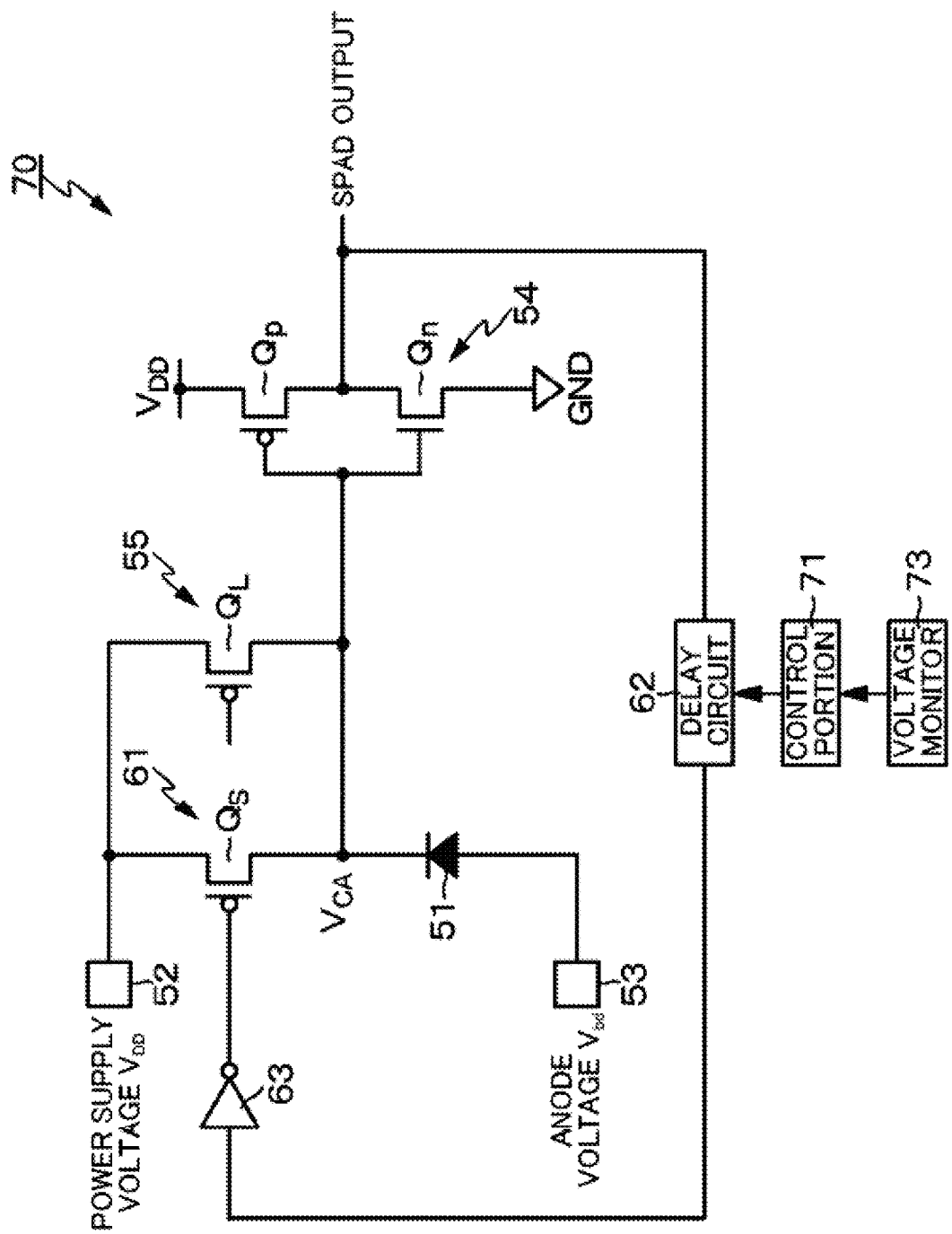
FIG. 10 is a circuit diagram showing a pixel circuit in a photodetection device according to a second example.

A second example is a modification of the first example and represents an example of adjusting the amount of delay based on a voltage monitoring result. FIG. 10 shows a circuit diagram of a pixel circuit in a photodetection device according to the second example.

While the amount of delay of the delay circuit 62 is controlled in accordance with a temperature of the SPAD element 51 in the first example, in the second example, a fluctuation of the power supply voltage $V_{DD}$ is monitored and the amount of delay of the delay circuit 62 is controlled in accordance with a voltage monitoring result thereof. Specifically, the pixel circuit 70 according to the second example is configured to include a voltage monitor 73 that monitors a fluctuation in the power supply voltage $V_{DD}$ in place of the temperature sensor 72 that detects a temperature of the SPAD element 51. In addition, the control portion 71 adjusts the amount of delay of the delay circuit 62 based on a monitoring result of the voltage monitor 73.

As described above, the pixel circuit 70 according to the second example is constituted by a combination of a passive recharge circuit and an active recharge circuit, and by adjusting the amount of delay of the delay circuit 62 based on a monitoring result of the voltage monitor 73, a fluctuation in the power supply voltage $V_{DD}$ is suppressed. Accordingly, in a similar manner to the first example, a risk of an excessive drop in the cathode voltage $V_{CA}$ causing an overvoltage equal to or exceeding a rated value to be applied to circuit elements can be reduced while realizing a short dead time DT.

Third Example

Figure 11:
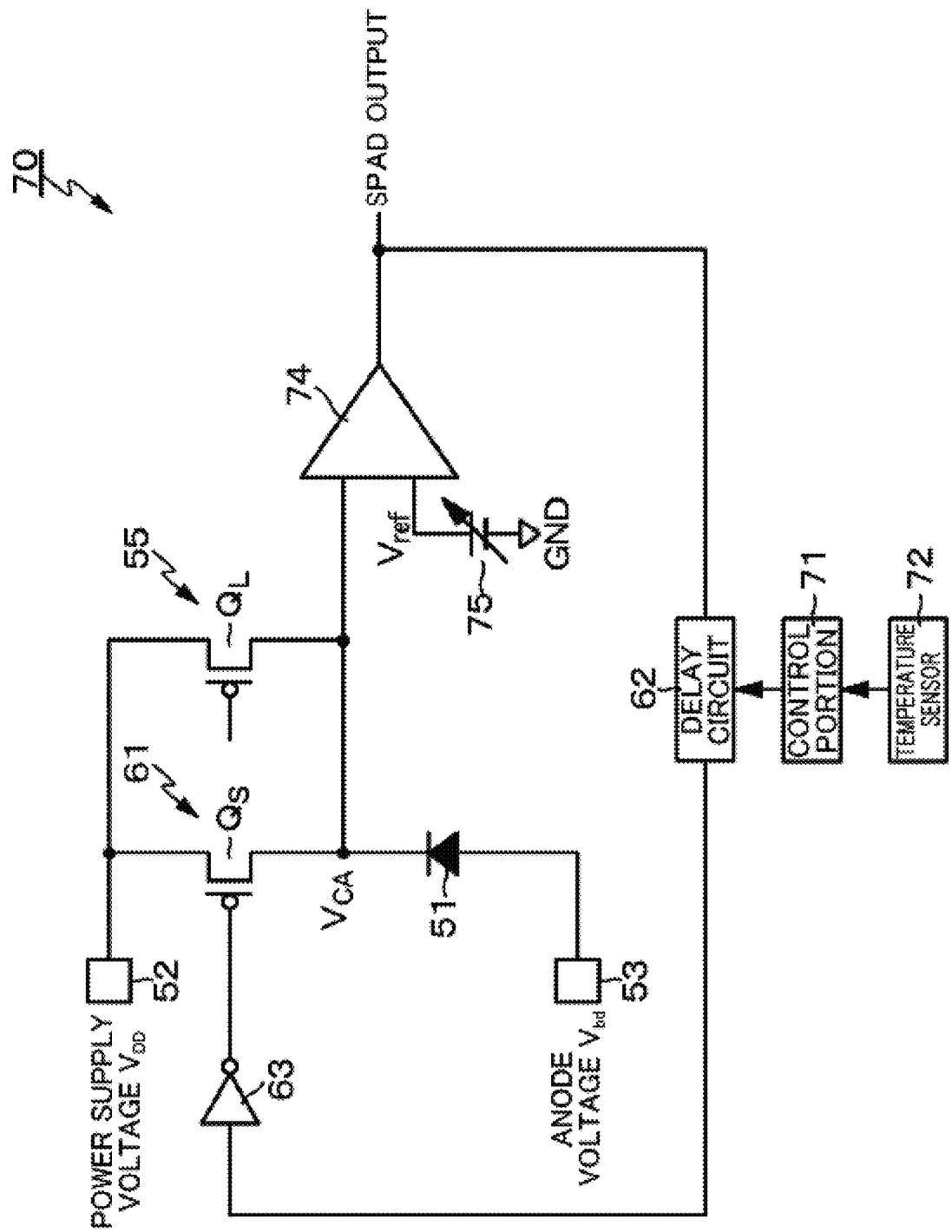
FIG. 11 is a circuit diagram showing a pixel circuit in a photodetection device according to a third example.

A third example is a modification of the first example and represents an example of including a comparator in a feedback circuit. FIG. 11 shows a circuit diagram of a pixel circuit in a photodetection device according to the third example.

The pixel circuit 70 according to the third example is configured to include a comparator 74 in a feedback circuit for active recharge. More specifically, in the pixel circuit 70 according to the third example which is constituted by a combination of a passive recharge circuit and an active recharge circuit, a circuit (a path) from the SPAD output to the control input of the switch circuit 61 is a feedback circuit for performing active recharge based on the SPAD output. In addition, besides the delay circuit 62, the feedback circuit further includes the comparator 74.

The comparator 74 receives the cathode voltage $V_{CA}$ of the SPAD element 51 as a comparison input (one of inputs), receives a reference voltage $V_{ref}$ that is generated by a reference voltage generating portion 75 as a comparison reference input (the other input), and compares the cathode voltage $V_{CA}$ with the reference voltage $V_{ref}$. In addition, a comparison result of the comparator 74 or, in other words, an analog-digital transformation result is supplied to the delay circuit 62 as an input thereof and, at the same time, derived as a SPAD output that is a pixel circuit output. The reference voltage $V_{ref}$ that is generated by the reference voltage generating portion 75 is configured so that a voltage value thereof is variable.

As described above, the pixel circuit 70 according to the third example is the pixel circuit 70 according to the first example but including the comparator 74 in a feedback circuit for active recharge and having been configured such that a voltage value of the reference voltage $V_{ref}$ of the comparator 74 is variable. In addition, by controlling the voltage value of the reference voltage $V_{ref}$, a level of analog-digital transformation in the comparator 74 can be adjusted.

While a configuration in which the comparator 74 is provided inside the feedback circuit has been exemplified with respect to the pixel circuit 70 according to the first example which controls an amount of delay of the delay circuit 62 in accordance with a temperature of the SPAD element 51, a similar configuration can be adopted with respect to the pixel circuit 70 according to the second example which controls the amount of delay of the delay circuit 62 based on a voltage monitoring result.

Fourth Example

Figure 12:
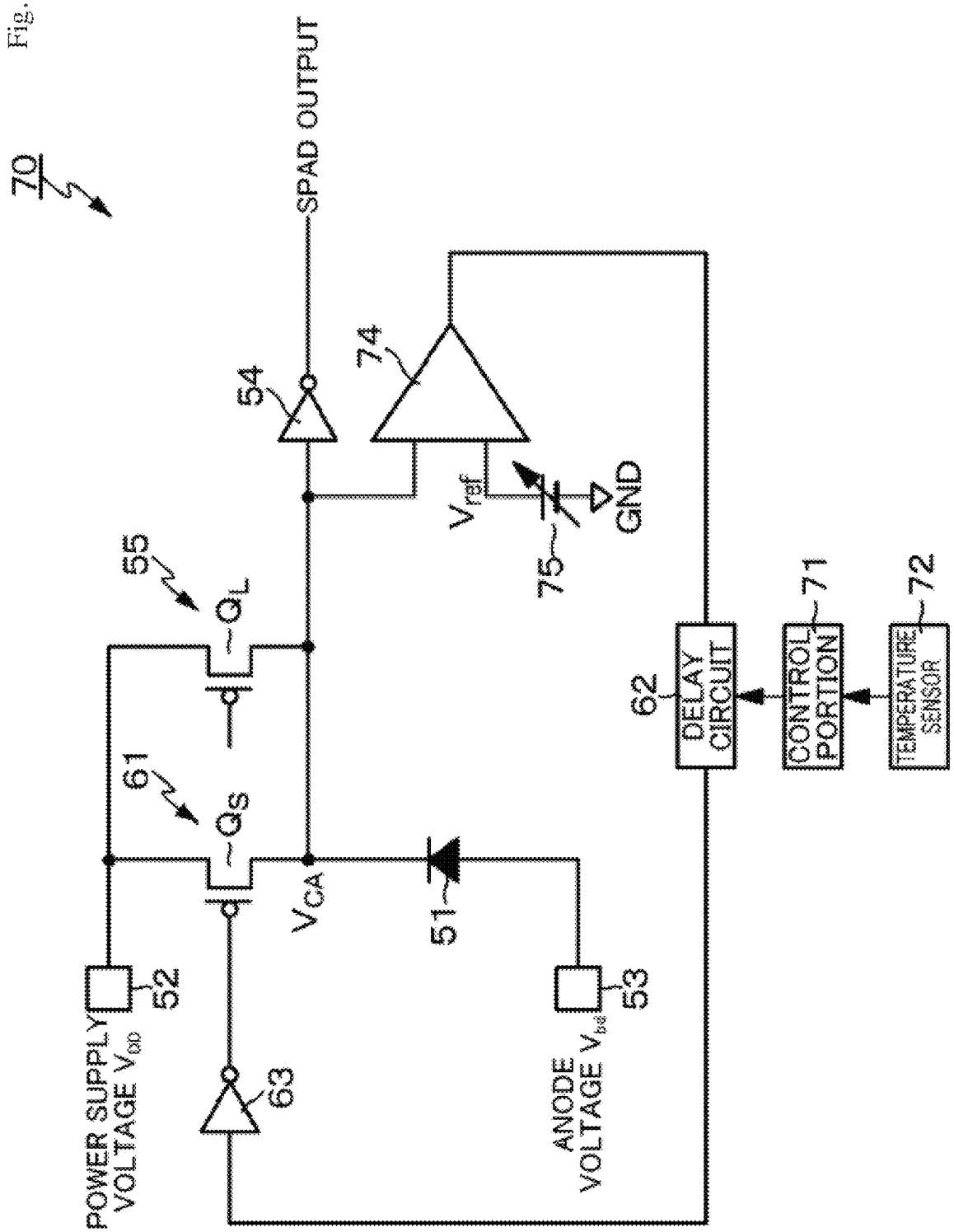
FIG. 12 is a circuit diagram showing a pixel circuit in a photodetection device according to a fourth example.

A fourth example is a modification of the third example and represents a configuration example provided with separate paths for a SPAD output and an active recharge. FIG. 12 shows a circuit diagram of a pixel circuit in a photodetection device according to the fourth example.

In the pixel circuit 70 according to the third example, a configuration is adopted in which a comparison result of the comparator 74 is derived as the SPAD output and supplied to the switch circuit 61 via the delay circuit 62 inside the feedback circuit.

On the other hand, the pixel circuit 70 according to the fourth example is configured such that a path for deriving the SPAD output that is a pixel circuit output is separated from a path that includes a feedback circuit for active recharge. In other words, a configuration is adopted in which the path including the feedback circuit is provided as a separate path from the path for deriving the SPAD output. More specifically, in the pixel circuit 70 according to the fourth example, a configuration is adopted in which the cathode voltage $V_{CA}$ of the SPAD element 51 is derived as the SPAD output via the waveform shaping circuit 54.

In addition, the comparator 74 is configured to receive the cathode voltage $V_{CA}$ of the SPAD element 51 as an input and supply a comparison result thereof to the switch circuit 61 via the delay circuit 62 inside the feedback circuit.

Even with the pixel circuit 70 according to the fourth example that is configured so that the path of the SPAD output and the path for active recharge are separated from each other as described above, a similar operational advantage to the pixel circuit 70 according to the third example can be obtained. In other words, by controlling a voltage value of the reference voltage $V_{ref}$ of the comparator 74, a level of analog-digital transformation in the comparator 74 can be adjusted.

While a configuration that is applied to the pixel circuit 70 according to the first example which controls the amount of delay of the delay circuit 62 in accordance with a temperature of the SPAD element 51 has been exemplified above, a similar configuration can be adopted with respect to the pixel circuit 70 according to the second example which controls the amount of delay of the delay circuit 62 based on a voltage monitoring result.

<Modifications>

While the technique according to the present disclosure has been heretofore described based on a preferable embodiment, the technique according to the present disclosure is not limited to the embodiment. Configurations and structures of an imaging device described in the embodiment presented above are exemplary and various modifications can be made thereto as deemed appropriate.

For example, while the embodiment presented above has been described using examples in which a SPAD element is used as a light-receiving element, the light-receiving element is not limited to a SPAD element and similar operational advantages can be obtained using an element such as an APD or a CAPD.

<Example of Application of Technique According to Present Disclosure>

The technique according to the present disclosure can be applied to various products. Hereinafter, a more specific application example will be described.

For example, the technique according to the present disclosure may be realized as a distance measurement device to be mounted to any of various types of mobile bodies including an automobile, an electric vehicle, a hybrid electric vehicle, a motorcycle, a bicycle, personal mobility, an airplane, a drone, an ocean vessel, a robot, construction machinery, and agricultural and farm machinery (a tractor).

[Mobile Body]

Figure 13:
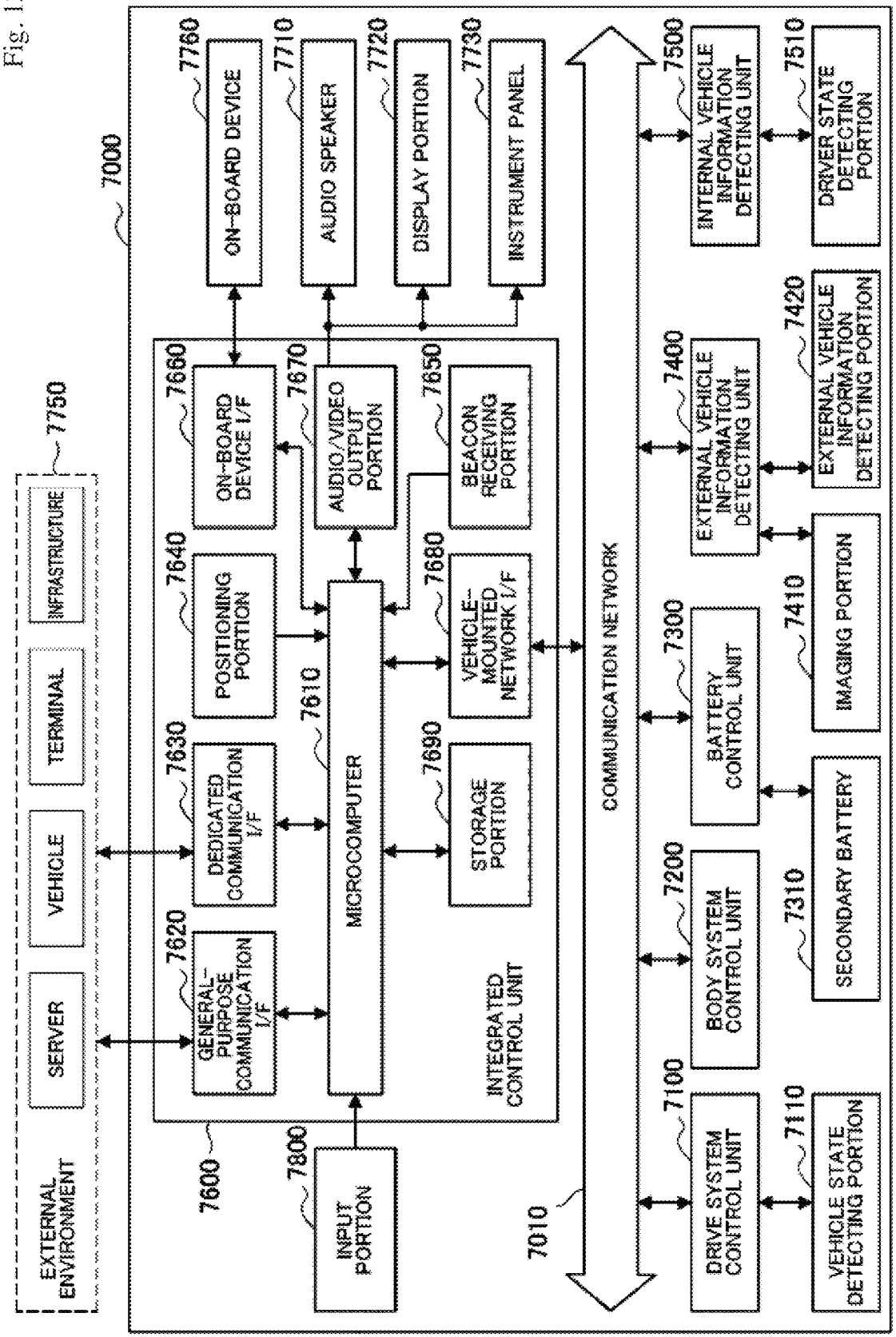
FIG. 13 is a block diagram showing a schematic configuration example of a vehicle control system that represents an example of a mobile body control system to which the technique according to the present disclosure may be applied.

FIG. 13 is a block diagram showing a schematic configuration example of a vehicle control system 7000 that represents an example of a mobile body control system to which the technique according to the present disclosure may be applied. The vehicle control system 7000 includes a plurality of electronic control units that are connected via a communication network 7010. In the example shown in FIG. 13, the vehicle control system 7000 includes a drive system control unit 7100, a body system control unit 7200, a battery control unit 7300, an external vehicle information detecting unit 7400, an internal vehicle information detecting unit 7500, and an integrated control unit 7600. The communication network 7010 that connects the plurality of control units may be a vehicle-mounted communication network compliant with an arbitrary standard such as a CAN (Controller Area Network), a LIN (Local Interconnect Network), a LAN (Local Area Network), or FlexRay (registered trademark).

Each control unit includes a microcomputer that performs arithmetic processing in accordance with various programs, a storage portion that stores programs to be executed by the microcomputer, parameters to be used in various calculations, and the like, and a drive circuit that drives various apparatuses which are control targets. Each control unit includes a network I/F for communicating with other control units via the communication network 7010 and a communication I/F for communicating with apparatuses, sensors, and the like inside and outside the vehicle via wired communication or wireless communication. FIG. 13 illustrates, as functional components of the integrated control unit 7600, a microcomputer 7610, a general-purpose communication I/F 7620, a dedicated communication I/F 7630, a positioning portion 7640, a beacon receiving portion 7650, an on-board device I/F 7660, an audio/video output portion 7670, a vehicle-mounted network I/F 7680, and a storage portion 7690. The other control units similarly include a microcomputer, a communication I/F, a storage portion, and the like.

The drive system control unit 7100 controls operations of apparatuses related to a drive system of a vehicle in accordance with various programs. For example, the drive system control unit 7100 functions as a control apparatus of a drive force generation apparatus for generating a drive force of the vehicle such as an internal engine or a drive motor, a control apparatus of a drive force transmission mechanism for transmitting the drive force to wheels, a control apparatus of a steering mechanism for adjusting a steering angle of the vehicle, and a control apparatus of a braking apparatus that generates a brake force of the vehicle. The drive system control unit 7100 may have functions as a control apparatus of an ABS (Antilock Brake System), a control apparatus of ESC (Electronic Stability Control), or the like.

A vehicle state detecting portion 7110 is connected to the drive system control unit 7100. For example, the vehicle state detecting portion 7110 includes at least one of a gyroscope sensor that detects an angular velocity of a rotational motion of a shaft of a vehicle body, an acceleration sensor that detects an acceleration of the vehicle, and a sensor for detecting an operation amount of a gas pedal, an operation amount of a brake pedal, a steering angle of a steering wheel, the number of revolutions of an engine, a rotational speed of a wheel, or the like. The drive system control unit 7100 performs arithmetic processing using a signal input from the vehicle state detecting portion 7110 and controls an internal engine, a drive motor, an electric power steering apparatus, a brake apparatus, or the like.

The body system control unit 7200 controls operations of various apparatuses mounted to the vehicle body in accordance with various programs. For example, the body system control unit 7200 functions as a control apparatus of a key-less entry system, a smart key system, a power window apparatus, or various lamps such as head lamps, tail lamps, brake lamps, turn indicators, and fog lamps. In this case, radio waves or signals of various switches which are transmitted from a portable device that substitutes as a key may be input to the body system control unit 7200. The body system control unit 7200 accepts input of the radio waves or signals and controls a door lock apparatus, the power window apparatus, the lamps, and the like of the vehicle.

The battery control unit 7300 controls a secondary battery 7310 that is a power supply source of the drive motor in accordance with various programs. For example, information on a battery temperature, a battery output voltage, a battery remaining capacity, or the like is input to the battery control unit 7300 from a battery apparatus including the secondary battery 7310. The battery control unit 7300 uses these signals to perform arithmetic processing to control temperature regulation of the secondary battery 7310 or to control a cooling apparatus or the like included in the battery apparatus.

The external vehicle information detecting unit 7400 detects information on an exterior of the vehicle that is mounted with the vehicle control system 7000. For example, at least one of an imaging portion 7410 and an external vehicle information detecting portion 7420 is connected to the external vehicle information detecting unit 7400. The imaging portion 7410 includes at least one of a ToF (Time of Flight) camera, a stereo camera, a monocular camera, an infrared camera, and other cameras. For example, the external vehicle information detecting portion 7420 includes at least one of an environmental sensor for detecting present weather or meteorological phenomena and an ambient information detection sensor for detecting other vehicles, obstacles, pedestrians, or the like around the vehicle mounted with the vehicle control system 7000.

For example, the environmental sensor may be at least one of a raindrop sensor that detects rainy weather, a fog sensor that detects fog, a sunshine sensor that detects a degree of sunshine, and a snow sensor that detects snowfall. The ambient information detection sensor may be at least one of an ultrasonic sensor, a radar apparatus, and a LIDAR (Light Detection and Ranging, Laser Imaging Detection and Ranging) apparatus. The imaging portion 7410 and the external vehicle information detecting portion 7420 may be respectively included as an independent sensor or an independent apparatus or may be included as an apparatus that integrates a plurality of sensors or apparatuses.

Figure 14:
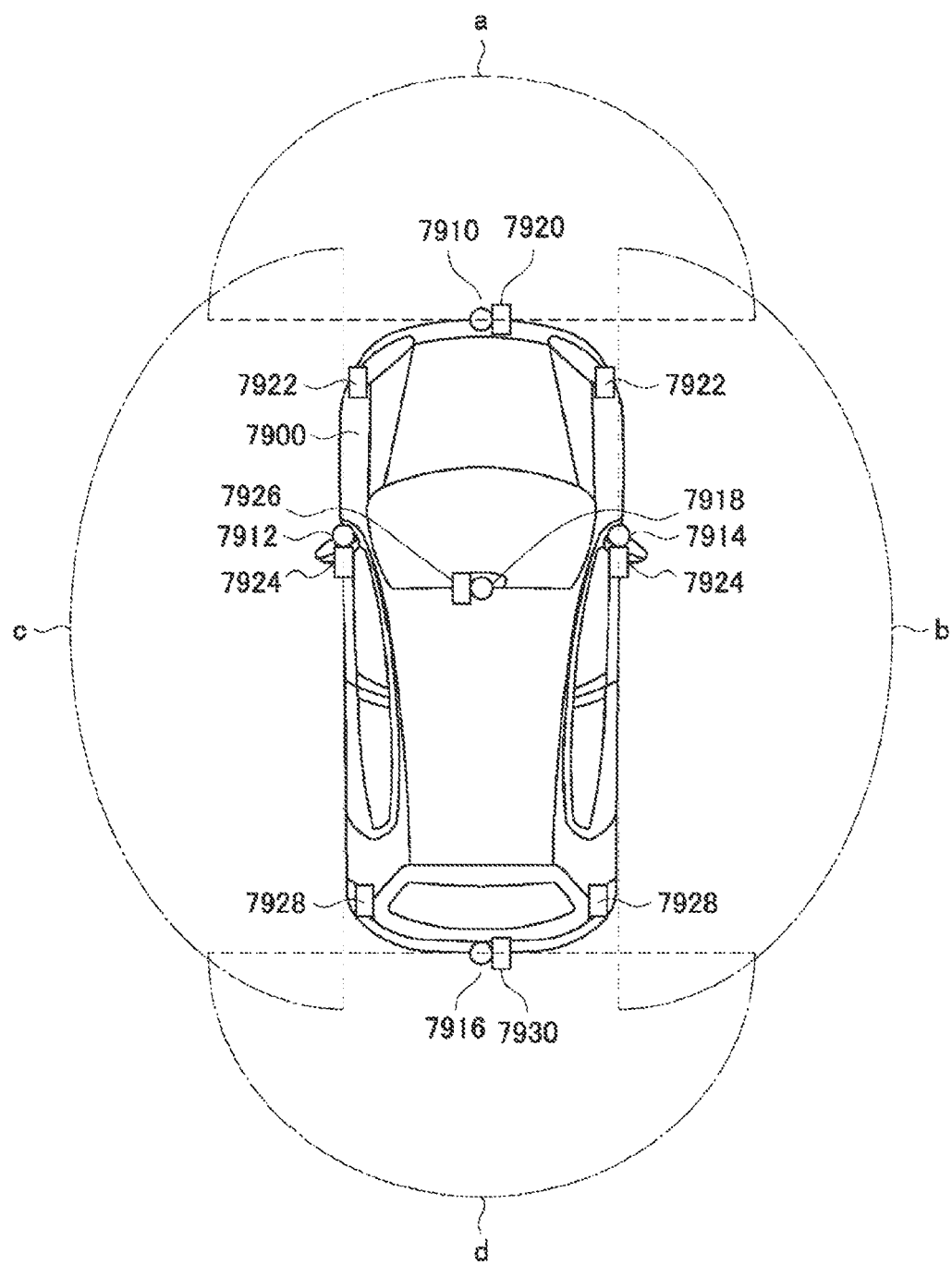
FIG. 14 is a diagram showing an example of an installation position of a distance measurement device.

FIG. 14 shows an example of installation positions of the imaging portion 7410 and the external vehicle information detecting portion 7420. For example, imaging portions 7910, 7912, 7914, 7916, and 7918 are provided at least one position among a front nose, a side mirror, a rear bumper, a rear door, and an upper part of a front glass inside a cabin of a vehicle 7900. The imaging portion 7910 that is provided on the front nose and the imaging portion 7918 that is provided in the upper part of the front glass inside the cabin mainly acquire an image of the front of the vehicle 7900. The imaging portions 7912 and 7914 that are provided on the side mirrors mainly acquire an image of the sides of the vehicle 7900. The imaging portion 7916 that is provided on the rear bumper or the rear door mainly acquires an image of the rear of the vehicle 7900. The imaging portion 7918 that is provided in the upper part of the front glass inside the cabin is mainly used to detect vehicles ahead, pedestrians, obstacles, traffic lights, traffic signs, lanes, and the like.

FIG. 14 shows an example of photographic ranges of the respective imaging portions 7910, 7912, 7914, and 7916. An imaging range a represents an imaging range of the imaging portion 7910 that is provided on the front nose, imaging ranges b and c respectively represent imaging ranges of the imaging portions 7912 and 7914 that are provided on the side mirrors, and an imaging range d represents an imaging range of the imaging portion 7916 that is provided on the rear bumper or the rear door. For example, by superimposing pieces of image data captured by the imaging portions 7910, 7912, 7914, and 7916, a bird's-eye view image of the vehicle 7900 as viewed from above is obtained.

For example, external vehicle information detecting portions 7920, 7922, 7924, 7926, 7928, and 7930 that are provided in the front, the rear, the sides, a corner, and the upper part of the front glass inside the cabin of the vehicle 7900 may be ultrasonic sensors or radar apparatuses. For example, the external vehicle information detecting portions 7920, 7926, and 7930 that are provided on the front nose, the rear bumper, the rear door, and the upper part of the front glass inside the cabin of the vehicle 7900 may be LIDAR apparatuses. The external vehicle information detecting portions 7920 to 7930 are mainly used to detect vehicles ahead, pedestrians, obstacles, and the like.

Let us return to FIG. 13 to continue with the description. The external vehicle information detecting unit 7400 causes the imaging portion 7410 to capture an image of the exterior of the vehicle and receives captured image data. In addition, the external vehicle information detecting unit 7400 receives detection information from the external vehicle information detecting portion 7420 being connected thereto. When the external vehicle information detecting portion 7420 is an ultrasonic sensor, a radar apparatus, or a LIDAR apparatus, the external vehicle information detecting unit 7400 causes the external vehicle information detecting portion 7420 to transmit ultrasonic waves, electromagnetic waves, or the like and receives information on received reflected waves. Based on the received information, the external vehicle information detecting unit 7400 may perform object detection processing or distance detection processing with respect to people, vehicles, obstacles, signs, characters on road surfaces, and the like. Based on the received information, the external vehicle information detecting unit 7400 may perform environmental recognition processing for recognizing rainfall, fog, road surface conditions, or the like. Based on the received information, the external vehicle information detecting unit 7400 may calculate a distance to an object outside of the vehicle.

In addition, based on received image data, the external vehicle information detecting unit 7400 may perform image recognition processing or distance detection processing for recognizing people, vehicles, obstacles, signs, characters on road surfaces, and the like. The external vehicle information detecting unit 7400 may perform processing such as distortion correction or positioning with respect to the received image data and composite the pieces of image data captured by different imaging portions 7410 to generate a bird's-eye view image or a panoramic image. The external vehicle information detecting unit 7400 may perform viewpoint transformation processing using pieces of image data captured by different imaging portions 7410.

The internal vehicle information detecting unit 7500 detects information on an interior of the vehicle. For example, a driver state detecting portion 7510 that detects a state of a driver is connected to the internal vehicle information detecting unit 7500. The driver state detecting portion 7510 may include a camera that captures an image of the driver, a biometric sensor that detects biological information of the driver, a microphone that collects sound inside the cabin, or the like. For example, the biometric sensor is provided on a seat surface, the steering wheel, or the like, and detects biological information of a passenger sitting on the seat or the driver holding the steering wheel. Based on detection information input from the driver state detecting portion 7510, the internal vehicle information detecting unit 7500 may calculate a degree of fatigue or a degree of concentration of the driver or may determine whether or not the driver has fallen asleep. The internal vehicle information detecting unit 7500 may perform processing such as noise cancellation processing with respect to a collected sound signal.

The integrated control unit 7600 controls overall operations in the vehicle control system 7000 in accordance with various programs. An input portion 7800 is connected to the integrated control unit 7600. The input portion 7800 is realized by an apparatus on which a passenger can perform input operations such as a touch panel, a button, a microphone, a switch, or a lever. Data obtained by subjecting sound input from the microphone to speech recognition may be input to the integrated control unit 7600. For example, the input portion 7800 may be a remote-controlled apparatus using infrared light or other radio waves or an externally-connected device such as a mobile phone or a PDA (Personal Digital Assistant) that accommodates operations of the vehicle control system 7000. For example, the input portion 7800 may be a camera, in which case a passenger can input information by gesturing to the camera. Alternatively data obtained by detecting a motion of a wearable apparatus being worn by a passenger may be input. Furthermore, for example, the input portion 7800 described above may include an input control circuit or the like which generates an input signal based on information input by a passenger or the like using the input portion 7800 and which outputs the generated input signal to the integrated control unit 7600. By operating the input portion 7800, a passenger or the like inputs various types of data and issues instructions to perform processing operations with respect to the vehicle control system 7000.

The storage portion 7690 may include a ROM (Read Only Memory) that stores various programs to be executed by the microcomputer and a RAM (Random Access Memory) that stores various parameters, calculation results, sensor values, or the like. In addition, the storage portion 7690 may be realized by a magnetic storage device such as an HDD (Hard Disk Drive), a semiconductor storage device, an optical storage device, a magneto-optical storage device, or the like.

The general-purpose communication I/F 7620 is a general-purpose communication I/F that mediates communication with various devices that are present in an external environment 7750. The general-purpose communication I/F 7620 may implement a cellular communication protocol such as GSM (registered trademark) (Global System of Mobile communications), WiMAX, LTE (Long Term Evolution), or LTE-A (LTE-Advanced) or another wireless communication protocol such as wireless LAN (also referred to as Wi-Fi (registered trademark)) or Bluetooth (registered trademark). For example, the general-purpose communication I/F 7620 may connect to a device (for example, an application server or a control server) present on an external network (for example, the Internet, a cloud network, or a company-specific network) via a base station or an access point. In addition, for example, the general-purpose communication I/F 7620 may connect to a terminal (for example, a terminal belonging to a driver, a pedestrian, a terminal of a store, or an MTC (Machine Type Communication) terminal) that is present in a vicinity of the vehicle using P2P (Peer To Peer) technology.

The dedicated communication I/F 7630 is a communication I/F that supports a communication protocol designed to be used in a vehicle. For example, the dedicated communication I/F 7630 may implement a standard protocol such as WAVE (Wireless Access in Vehicle Environment) that is a combination of IEEE 802.11p constituting a lower layer and IEEE 1609 constituting a higher layer, DSRC (Dedicated Short Range Communications), or a cellular communication protocol. Typically, the dedicated communication I/F 7630 carries out V2X communication that is a concept including one or more of communication between vehicles (Vehicle to Vehicle communication), communication between a road and a vehicle (Vehicle to Infrastructure communication), communication between a vehicle and a home (Vehicle to Home communication), and communication between a pedestrian and a vehicle (Vehicle to Pedestrian communication).

For example, the positioning portion 7640 receives a GNSS (Global Navigation Satellite System) signal from a GNSS satellite (for example, a GPS (Global Positioning System) signal from a GPS satellite) and executes positioning, and generates positional information including a latitude, a longitude, and an elevation of the vehicle. Alternatively, the positioning portion 7640 may specify a current position by exchanging signals with a wireless access point or acquire positional information from a terminal such as a mobile phone, a PHS, or a smartphone with a positioning function.

For example, the beacon receiving portion 7650 receives radio waves or electromagnetic waves emitted from a radio station or the like installed on a road and acquires information such as a current position, congestions, closures, and required time. Alternatively, the function of the beacon receiving portion 7650 may be included in the dedicated communication I/F 7630 described above.

The on-board device I/F 7660 is a communication interface that mediates communication between the microcomputer 7610 and various on-board devices 7760 that are present inside the vehicle. The on-board device I/F 7660 may establish a wireless connection using a wireless communication protocol such as a wireless LAN, Bluetooth (registered trademark), NFC (Near Field Communication), or WUSB (Wireless USB). In addition, the on-board device I/F 7660 may establish, via a connection terminal (not illustrated) (and a cable when necessary), a wired connection such as USB (Universal Serial Bus), HDMI (registered trademark) (High-Definition Multimedia Interface), or MHL (Mobile High-definition Link). For example, the on-board devices 7760 may include at least one of a mobile device or a wearable device that is held or worn by a passenger and an information device to be carried onto or attached to the vehicle.

Furthermore, the on-board devices 7760 may include a navigation apparatus that searches a route to an arbitrary destination. The on-board device I/F 7660 exchanges control signals and data signals with the on-board devices 7760.

The vehicle-mounted network I/F 7680 is an interface that mediates communication between the microcomputer 7610 and the communication network 7010. The vehicle-mounted network I/F 7680 transmits and receives signals and the like in accordance with a prescribed protocol that is supported by the communication network 7010.

The microcomputer 7610 of the integrated control unit 7600 controls the vehicle control system 7000 in accordance with various programs based on information acquired via at least one of the general-purpose communication I/F 7620, the dedicated communication I/F 7630, the positioning portion 7640, the beacon receiving portion 7650, the on-board device I/F 7660, and the vehicle-mounted network I/F 7680. For example, based on acquired information on the exterior and the interior of the vehicle, the microcomputer 7610 may calculate a control target value of the drive force generation apparatus, the steering mechanism, or the brake apparatus and output a control command to the drive system control unit 7100. For example, the microcomputer 7610 may perform cooperative control for the purpose of realizing functions of an ADAS (Advanced Driver Assistance System) including collision avoidance or crash mitigation of the vehicle, headway control based on an inter-vehicular distance, cruise control, a collision warning of the vehicle, and a lane departure warning of the vehicle. In addition, by controlling the drive force generation apparatus, the steering mechanism, the brake apparatus, or the like based on acquired information on a periphery of the vehicle, the microcomputer 7610 may perform cooperative control for the purpose of automated driving or the like that enables the vehicle to travel autonomously without having to rely on operations by the driver.

The microcomputer 7610 may generate three-dimensional distance information between the vehicle and a surrounding object such as a structure or a person and create local map information including peripheral information of a current position of the vehicle based on information acquired via at least one of the general-purpose communication I/F 7620, the dedicated communication I/F 7630, the positioning portion 7640, the beacon receiving portion 7650, the on-board device I/F 7660, and the vehicle-mounted network I/F 7680. In addition, based on acquired information, the microcomputer 7610 may predict danger such as a collision involving the vehicle, an approach by a pedestrian or the like, or entering a closed road and generate a warning signal. For example, the warning signal may be a signal for generating a warning sound or turning on a warning lamp.

The audio/video output portion 7670 transmits an output signal of at least one of sound and an image to an output apparatus that is capable of audibly or visually notifying a passenger of the vehicle or the outside of the vehicle of information. In an example shown in FIG. 13, an audio speaker 7710, a display portion 7720, and an instrument panel 7730 are exemplified as output apparatuses. For example, the display portion 7720 may include at least one of an on-board display and a head-up display. The display portion 7720 may have an AR (Augmented Reality) display function. The output apparatus may be an apparatus other than those described above such as headphones, a wearable device such as a spectacle-type display to be worn by a passenger, a projector, or a lamp. When the output apparatus is a display apparatus, the display apparatus visually displays, in various formats such as a text, an image, a table, and a graph, results obtained by various types of processing performed by the microcomputer 7610 and information received from other control units. In addition, when the output apparatus is an audio output apparatus, the audio output apparatus converts an audio signal constituted by reproduced speech data, acoustic data, or the like into an analog signal and auditorily outputs the converted analog signal.

In the example shown in FIG. 13, at least two control units connected via the communication network 7010 may be integrated as a single control unit. Alternatively, each control unit may be constituted by a plurality of control units. Furthermore, the vehicle control system 7000 may include other control units that are not illustrated. In addition, a part of or all of the functions assumed by any control unit in the description provided above may be shouldered by another control unit. In other words, as long as information is to be transmitted and received via the communication network 7010, prescribed arithmetic processing may be performed by any control unit. In a similar manner, a sensor or an apparatus connected to any control unit may be connected to another control unit and, at the same time, a plurality of control units may mutually transmit and receive detection information via the communication network 7010.

This concludes the description of an example of a vehicle control system to which the technique according to the present disclosure may be applied. The technique according to the present disclosure may be applied to, for example, the imaging portions 7910, 7912, 7914, 7916, and 7918 and external vehicle information detecting portions 7920, 7922, 7924, 7926, 7928, and 7930 among the configuration described above. In addition, by applying the technique according to the present disclosure, since a risk of an overvoltage being applied to a circuit element can be eliminated while maintaining advantages of the active system, deterioration of characteristics of the circuit element can be suppressed and a photodetection device with high reliability can be realized. Furthermore, mounting the photodetection device enables, example, a vehicle control system capable of detecting an imaging object with high accuracy to be constructed.

<Configurations Adoptable by Present Disclosure>

The present disclosure can also be configured as follows.

<A. Photodetection Device<

[A-1] A photodetection device, including:
a light-receiving element;
a load circuit connected to the light-receiving element;
a switch circuit connected to the light-receiving element; and
a feedback circuit configured to operate the switch circuit in accordance with an output from the light-receiving element, wherein
the feedback circuit has a delay circuit.

[A-2] The photodetection device according to [A-1], wherein
an amount of delay of the delay circuit is variable.

[A-3] The photodetection device according to [A-2], wherein
the amount of delay of the delay circuit is controlled in accordance with an element characteristic of the light-receiving element.

[A-4] The photodetection device according to [A-3], wherein
the element characteristic of the light-receiving element is a temperature of the light-receiving element.

[A-5] The photodetection device according to [A-2], wherein
the amount of delay of the delay circuit is controlled based on a monitoring result of a fluctuation of a power supply voltage.

[A-6] The photodetection device according to any one of [A-1] to [A-5], wherein
the feedback circuit further includes a comparator.

[A-7] The photodetection device according to [A-6], wherein
the comparator is configured to receive an output from the light-receiving element as a comparison input, receive a reference voltage as a comparison reference input, and provide the delay circuit with a comparison result thereof as an input.

[A-8] The photodetection device according to [A-7], wherein
a voltage value of the reference voltage of the comparator is variable.

[A-9] The photodetection device according to [A-7] or [A-8], wherein
the comparison result of the comparator is derived as a pixel circuit output based on an output of the light-receiving element.

[A-10] The photodetection device according to [A-7] or [A-8], wherein
a path including the feedback circuit is provided as a separate path from a path for deriving an output of the light-receiving element as a pixel circuit output.

[A-11] The photodetection device according to any one of [A-1] to [A-10], wherein
the light-receiving element is an element configured to generate a signal in response to receiving a photon.

[A-12] The photodetection device according to [A-11], wherein
the light-receiving element is constituted by a single photon avalanche diode.

<<B. Distance Measurement Device>>

[B-1] A distance measurement device, including:
a light source configured to radiate light toward a measurement object; and
a photodetection device configured to detect light reflected by the measurement object, wherein
the photodetection device includes:
a light-receiving element;
a load circuit connected to the light-receiving element;
a switch circuit connected to the light-receiving element; and
a feedback circuit configured to operate the switch circuit in accordance with an output from the light-receiving element, and
the feedback circuit has a delay circuit.

[B-2] The distance measurement device according to [B-1], wherein
an amount of delay of the delay circuit is variable.

[B-3] The distance measurement device according to [B-2], wherein
the amount of delay of the delay circuit is controlled in accordance with an element characteristic of the light-receiving element.

[B-4] The distance measurement device according to [B-3], wherein
the element characteristic of the light-receiving element is a temperature of the light-receiving element.

[B-5] The distance measurement device according to [B-2], wherein
the amount of delay of the delay circuit is controlled based on a monitoring result of a fluctuation of a power supply voltage.

[B-6] The distance measurement device according to any one of [B-1] to [B-5], wherein
the feedback circuit further includes a comparator.

[B-7] The distance measurement device according to [B-6], wherein
the comparator is configured to receive an output from the light-receiving element as a comparison input, receive a reference voltage as a comparison reference input, and provide the delay circuit with a comparison result thereof as an input.

[B-8] The distance measurement device according to [B-7], wherein
a voltage value of the reference voltage of the comparator is variable.

[B-9] The distance measurement device according to [B-7] or [B-8], wherein
the comparison result of the comparator is derived as a pixel circuit output based on an output of the light-receiving element.

[B-10] The distance measurement device according to [B-7] or [B-8], wherein
a path including the feedback circuit is provided as a separate path from a path for deriving an output of the light-receiving element as a pixel circuit output.

[B-11] The distance measurement device according to any one of [B-1] to [B-10], wherein
the light-receiving element is an element configured to generate a signal in response to receiving a photon.

[B-12] The distance measurement device according to [B-11], wherein
the light-receiving element is constituted by a single photon avalanche diode.

REFERENCE SIGNS LIST

1 Distance measurement device
10 Subject (measurement object)
20 Light source
21 Laser driver
22 Laser light source
23 Diffusing lens
30 Photodetection device
31 Light-receiving lens
32 Photosensor
33 Circuit portion
40 Control portion
50 Pixel circuit of passive system
51 SPAD element
54 Waveform shaping circuit
55 Load circuit
60 Pixel circuit of active system
61 Switch circuit
62 (62A, 62B) Delay circuit
63 Inverter circuit
70 Pixel circuit of hybrid recharge system
71 Control portion
72 Temperature sensor
73 Voltage monitor
74 Comparator
75 Reference voltage generating portion

The invention claimed is:

1. A photodetection device, comprising:
a light-receiving element;
a load circuit electrically connected to the light-receiving element;
a switch circuit including a first terminal, a second terminal and a gate terminal, the first terminal being electrically connected to a power supply voltage, the second terminal being electrically connected to the light-receiving element; and
a feedback circuit configured to operate the switch circuit in accordance with an output from the light-receiving element, wherein
the feedback circuit includes a comparator and a delay circuit, and
the comparator is configured to receive an output from the light-receiving element as a comparison input, receive a reference voltage as a comparison reference input, and provide the delay circuit with a comparison result thereof as an input.

2. The photodetection device according to claim 1, wherein an amount of delay of the delay circuit is variable.

3. The photodetection device according to claim 2, wherein the amount of delay of the delay circuit is controlled in accordance with an element characteristic of the light-receiving element.

4. The photodetection device according to claim 3, wherein the element characteristic of the light-receiving element is a temperature of the light-receiving element.

5. The photodetection device according to claim 2, wherein the amount of delay of the delay circuit is controlled based on a monitoring result of a fluctuation of a power supply voltage.

6. The photodetection device according to claim 1, wherein a voltage value of the reference voltage of the comparator is variable.

7. The photodetection device according to claim 1, wherein the comparison result of the comparator is derived as a pixel circuit output based on an output of the light-receiving element.

8. The photodetection device according to claim 1, wherein a path including the feedback circuit is provided as a separate path from a path for deriving an output of the light-receiving element as a pixel circuit output.

9. The photodetection device according to claim 1, wherein the light-receiving element is an element configured to generate a signal in response to receiving a photon.

10. The photodetection device according to claim 9, wherein the light-receiving element is constituted by a single photon avalanche diode.

11. A distance measurement device, comprising:
a light source configured to radiate light toward a measurement object; and
a photodetection device configured to detect light reflected on the measurement object, wherein
the photodetection device includes:
a light-receiving element;
a load circuit electrically connected to the light-receiving element;
a switch circuit including a first terminal, a second terminal and a gate terminal, the first terminal being electrically connected to a power supply voltage, the second terminal being electrically connected to the light-receiving element; and
a feedback circuit configured to operate the switch circuit in accordance with an output from the light-receiving element, wherein
the feedback circuit includes a comparator and a delay circuit, and the comparator is configured to receive an output from the light-receiving element as a comparison input, receive a reference voltage as a comparison reference input, and provide the delay circuit with a comparison result thereof as an input.

12. The distance measurement device according to claim 11, wherein an amount of delay of the delay circuit is variable.

13. The distance measurement device according to claim 12, wherein the amount of delay of the delay circuit is controlled in accordance with an element characteristic of the light-receiving element.

14. The distance measurement device according to claim 13, wherein the element characteristic of the light-receiving element is a temperature of the light-receiving element.

15. The distance measurement device according to claim 12, wherein the amount of delay of the delay circuit is controlled based on a monitoring result of a fluctuation of a power supply voltage.

16. The distance measurement device according to claim 11, wherein a voltage value of the reference voltage of the comparator is variable.

\* \* \* \* \*